United States Patent [19]
Kozai et al.

[11] Patent Number: 5,541,440
[45] Date of Patent: Jul. 30, 1996

[54] ISOLATION STRUCTURE FOR SEMICONDUCTOR DEVICE

[75] Inventors: Yutaka Kozai, Tokyo; Kiyoto Watabe; Tatsuhiko Ikeda, both of Hyogo, all of Japan

[73] Assignee: Mitsubishi Denki Kabushiki Kaisha, Tokyo, Japan

[21] Appl. No.: 278,289

[22] Filed: Jul. 21, 1994

[30] Foreign Application Priority Data

Jul. 28, 1993 [JP] Japan .................................. 5-186446

[51] Int. Cl.⁶ ................................................ H01L 29/00
[52] U.S. Cl. ........................ 257/513; 257/519; 257/520; 257/374
[58] Field of Search .............................. 257/520, 374, 257/397, 398, 513, 519, 305, 301

[56] References Cited

U.S. PATENT DOCUMENTS

| | | | |
|---|---|---|---|
| 4,211,582 | 7/1980 | Horng et al. | 257/519 |
| 4,577,395 | 3/1986 | Shibata | 257/305 |
| 4,688,069 | 8/1987 | Joy et al. | 257/398 |
| 4,707,218 | 11/1987 | Giammarco et al. | 156/643 |
| 4,789,885 | 12/1988 | Brighton et al. | 257/520 |
| 5,306,940 | 4/1994 | Yamazaki | 257/374 |
| 5,457,339 | 10/1995 | Komori et al. | 257/513 |

FOREIGN PATENT DOCUMENTS

| | | | |
|---|---|---|---|
| 0298251 | 1/1989 | European Pat. Off. | 257/301 |
| 60-16441 | 1/1985 | Japan . | |
| 61-193477 | 8/1986 | Japan | 257/305 |
| 61-228658 | 10/1986 | Japan | 257/301 |
| 62-132341 | 6/1987 | Japan . | |
| 63-9948 | 1/1988 | Japan . | |
| 1-187866 | 7/1989 | Japan . | |
| 3-110856 | 5/1991 | Japan . | |
| 4-48647 | 2/1992 | Japan . | |
| 5-21591 | 1/1993 | Japan . | |

Primary Examiner—Sara W. Crane
Assistant Examiner—Courtney A. Bowers
Attorney, Agent, or Firm—Lowe, Price, LeBlanc & Becker

[57] ABSTRACT

It is an object of the present invention to provide a semiconductor device which has a high electrical isolation capability and an enhanced electrical reliability for avoiding short circuit of individual conductive layers, and the present invention also provides a method of manufacturing such a semiconductor device. An $n^+$ buried layer and an $n^-$ epitaxial growth layer are formed on a $p^-$ silicon substrate. An element isolation oxide film having a through hole is formed on the surface of $n^-$ epitaxial growth layer. A trench which penetrates through $n^-$ epitaxial growth layer and $n^+$ buried layer to reach a predetermined depth of $p^-$ silicon substrate is formed under through hole. A first insulating layer covers the internal wall of trench. A covering layer covers the sidewall of through hole. A filling layer is formed to fill trench so that the top surface thereof is located within through hole. A second insulating layer is formed on filling layer.

1 Claim, 40 Drawing Sheets

ISOLATION STRUCTURE FOR SEMICONDUCTOR DEVICE

BACKGROUND OF THE INVENTION

1. Field of the Invention

The present invention relates to a semiconductor device and a manufacturing method thereof, and more particularly, it is concerned with a semiconductor device having an element isolation structure and a method of manufacturing such a semiconductor device.

2. Description of the Background Art

In manufacturing semiconductor integrated circuitry, it is necessary to form an element isolation structure which isolates respective elements electrically for controlling individual elements completely independently in operation thereby avoiding an electrical interference among elements. Generally, a LOCOS (Local Oxidation of Silicon) method has widely been known to form the element isolation structure, and many revisions are made for that method for common use.

In the LOCOS method, in general, a channel stopper region is provided under an element isolation oxide film so as to improve an element isolation effect. The channel stopper region, however, is formed in contact with a bottom surface of the element isolation oxide film, i.e., in a position relatively shallow from a substrate surface. Also, a parasitic capacitance is generated in a p-n junction portion formed by the channel stopper region and the substrate. As a result, the parasitic capacitance generated in a position close to an element formed on the substrate surface. When, for example, a bipolar transistor is isolated by the element isolation oxide film formed by the LOCOS method, a high speed operation of the bipolar transistor is hindered by the parasitic capacitance.

Thus, a trench isolation is commonly used in the element isolation structure for isolating the bipolar transistor from the other elements. However, in the structure using only the trench for isolation, the parasitic capacitance tends to be generated between an Al (aluminum) interconnection to be formed in the subsequent step and the substrate. In this regard, a thick oxide film, for example, the element isolation oxide film formed by the LOCOS method, is required between the Al interconnection and the substrate.

As described above, a combination of the element isolation oxide film formed by the LOCOS method and the trench is adapted for the element isolation structure isolating the bipolar transistor from the other elements.

In the following, a conventional semiconductor device having an element isolation structure employed in a Bi-CMOS structure which includes a bipolar transistor and a CMOS (Complementary Metal Oxide Semiconductor) transistor on the same semiconductor substrate will be described.

FIG. 51 is a schematic sectional view of the Bi-CMOS structure in the conventional semiconductor device. Referring to FIG. 51, the Bi-CMOS structure includes on the same semiconductor substrate a bipolar transistor region 550, a pMOS transistor region 560, an nMOS transistor region 570, and an element isolation region 520.

Element isolation region 520 serves as a region for mainly isolating bipolar transistor region 550 from CMOS transistor regions 560, 570.

First, in bipolar transistor region 550, an $n^+$ buried layer 523 is formed on the surface of a $p^-$ silicon substrate 521. On the surface of n buried layer 523, an $n^-$ epitaxial growth layer 525 and an $n^+$ collector wall region 523a are formed.

A base region 551 and an $n^+$ emitter region 553 are formed on the surface of $n^-$ epitaxial growth layer 525. $n^+$ emitter region 553 is surrounded at its periphery by base region 551. Base region 551 is formed by a two-layered structure consisting of a $p^+$ base region 551a and a p type base region 551b.

A conductive layer 535 for extracting a base electrode is formed in contact with the surface of base region 551. The surface of conductive layer 535 for extracting the base electrode is covered by an insulating layer 537. A conductive layer 539 for extracting an emitter electrode is formed in contact with the surface of $n^+$ emitter region 553 via a contact hole 537f provided in insulating layer 537. Also, a conductive layer 543 is formed via a contact hole 541a provided in two insulating layers 537, 541 so as to be in contact with the surface of $n^+$ collector wall region 523a.

Next, in pMOS transistor region 560, $n^+$ buried layer 523 is formed on the surface of $p^-$ silicon substrate 521. $n^-$ epitaxial growth layer 525 is formed on the surface of $n^+$ buried layer 523. A pMOS transistor is formed on the surface of $n^-$ epitaxial growth layer 525.

The pMOS transistor includes a gate oxide film 561, a gate electrode 563, and a pair of $p^+$ source/drain regions 565, 565. Pair of $p^+$ source/drain regions 565, 565 are formed spaced by a predetermined distance from each other on the surface of $n^-$ epitaxial growth layer 525. Gate electrode 563 is formed on a region sandwiched by the pair of $p^+$ source/drain regions 565, 565 with gate oxide film 561 interposed therebetween.

Insulating layers 537, 541 are formed to cover the pMOS transistor. A contact hole 541b is formed penetrating through two insulating layers 537, 541 to reach a part of the surface of pair of $p^+$ source/drain regions 565, 565. A conductive layer 569 is formed in contact with $p^+$ source/drain regions 565, 565 via contact hole 541b.

In nMOS transistor region 570, a $p^+$ buried layer 524 is formed on the surface of $p^-$ silicon substrate 521. p type region 527 is formed on the surface of $p^+$ buried layer 524 by selectively implanting ions. The nMOS transistor is formed on the surface of p type region 527 made by selective ion implantation.

The nMOS transistor includes a gate oxide film 571, a gate electrode 573, and a pair of $n^+$ source/drain regions 575, 575. The pair of $n^+$ source/drain regions 575, 575 are formed spaced by a predetermined distance from each other on the surface of p type region 527 made by selective ion implantation. Gate electrode 573 is formed on a region sandwiched by the pair of $n^+$ source/drain regions 575, 575 with gate oxide film 571 interposed therebetween.

Insulating layers 537, 541 are formed to cover the nMOS transistor. A contact hole 541c is formed penetrating through two insulating layers 537, 541 to reach a part of the surface of pair of $n^+$ source/drain regions 575, 575. A conductive layer 579 is formed in contact with $n^+$ source/drain regions 575, 575 via contact hole 541c.

In element isolation region 520, an element isolation oxide film 501b is formed on the surface of $n^-$ epitaxial growth layer 525. A through hole 507a reaching the surface of $n^-$ epitaxial growth layer 525 is formed in element isolation oxide film 501b. Under through hole 507a, a trench 507b penetrating through $n^-$ epitaxial growth layer 525 and $n^+$ buried layer 523 to reach a position at a predetermined depth of $p^-$ silicon substrate 521.

A silicon oxide film 513 having a predetermined thickness is formed to cover the inner wall of trench 507b. A filling layer 517a is formed for filling trench 507b with the top surface thereof positioned within through hole 507a. Filling layer 517a is made of a polycrystalline silicon layer without any impurity implanted thereinto. A silicon oxide film 519 is formed on filling layer 517a.

A p$^+$ channel stopper region 515 is formed in a region under trench 507b in p$^-$ silicon substrate 521.

Now, a method of manufacturing the conventional semiconductor device will be described below.

FIGS. 52–64 are schematic cross sectional views showing in this order the manufacturing method of the conventional semiconductor device. First referring to FIG. 52, n$^+$ buried layer 523 and n$^-$ epitaxial growth layer 525 are formed stacked successively on the surface of p$^-$ silicon substrate 521. A silicon oxide film 501a is formed on the surface of n$^-$ epitaxial growth layer 525 by thermal oxidation. A silicon nitride film 502 which is patterned into a desired shape is formed on the surface of silicon oxide film 501a by a CVD (Chemical Vapor Deposition) method and the like. Using silicon nitride film 502 as a mask, thermal oxidation is selectively conducted.

Referring to FIG. 53, by this thermal oxidation, element isolation oxide film 501b is formed on the surface of n$^-$ epitaxial growth layer 525, and then, silicon nitride film 502 is removed.

Referring to FIG. 54, by removal of the silicon nitride film, surfaces of silicon oxide film 501a and element isolation oxide film 501b are exposed.

Referring to FIG. 55, a silicon nitride film 503 and a silicon oxide film 505 are formed stacked successively on the entire surface of the substrate by the CVD method.

Referring to FIG. 56, an opening 507c penetrating through silicon oxide film 505 and silicon nitride film 503 is formed by photolithography and an RIE (Reactive Ion Etching) method. A through hole 507a penetrating through element isolation oxide film 501b is formed at a portion where element isolation oxide film 501b is exposed from opening 507c. Then, anisotropic etching is carried out on the surface of n$^-$ epitaxial growth layer 525 exposed from through hole 507a. With thus etched, a trench 507b penetrating through two layers, that is, n$^-$ epitaxial growth layer 525 and n$^+$ buried layer 523 to reach a predetermined depth of p$^-$ silicon substrate 521 is formed.

Referring to FIG. 57, a rough surface is generated on the internal wall of trench 507b due to etching at the time of formation of trench 507b. Thermal oxidation is initially conducted in order to remove such roughness. The internal wall of trench 507b is oxidized through the thermal oxidation processing to form a silicon oxide film 511 covering the internal wall of trench 507b. Then, wet etching is carried out to remove silicon oxide film 511, eliminating the roughness of internal wall of trench 507b.

Referring to FIG. 58, such wet etching causes removal of silicon oxide film 511 covering the internal wall of trench 507b, and at the same time, etching-away of element isolation oxide film 501b and silicon oxide film 505 to a certain extent. More specifically, element isolation oxide film 501b is etched-away in a lateral direction from the wall surface of through hole 507a, since etching is carried out isotropically in wet etching. Also, silicon oxide film 505 is etched-away isotropically from the surface thereof by a predetermined amount.

Referring to FIG. 59, thermal oxidation processing is carried out again. Thus, the internal wall of trench 507b is oxidized to form a silicon oxide film 513 covering the internal wall of trench 507b. Ions are implanted onto the entire surface of the substrate, so that p type ions are implanted into p$^-$ silicon substrate 521 under the bottom surface of trench 507b. p$^+$ channel stopper region 515 is then formed by activating/diffusing the ions implanted into p$^-$ silicon substrate 521.

Referring to FIG. 60, a polycrystalline silicon film 517 without any impurity implanted thereinto is formed on the entire surface of silicon oxide film 505 by the CVD method so as to fill trench 507b, through hole 507a, and opening 507c. Then, the entire surface of polycrystalline silicon film 517 is subjected to etching.

Referring to FIG. 61, filling layer 517a filling trench 507b is formed by etching with the upper surface thereof located within through hole 507a. Silicon oxide film 505 serves as an etching stopper during etching of polycrystalline silicon film 517. Silicon oxide film 505 is then removed.

Referring to FIG. 6.2, the surface of silicon nitride film 503 is exposed after removal of silicon oxide film 505.

Referring to FIG. 63, a silicon oxide film 519 is formed on filling layer 517a by thermal oxidation with silicon nitride film 503 maintained. Filling of through hole 507a is mostly completed by formation of silicon oxide film 519. During thermal oxidation processing at the time of formation of silicon oxide film 519, silicon nitride film 503 prevents entry of oxidation species into the silicon substrate for avoiding excess oxidation of the silicon substrate. Then, silicon nitride film 503 is removed by etching as shown in FIG. 64.

Advantages of the above described element isolation structure wherein element isolation oxide film 501b and trench 507b are combined are that the operation of the bipolar transistor can be kept at a high speed and that occurrence of a junction leak current can be prevented. The below description will be made on such advantages.

In the element isolation structure formed by combining element isolation oxide film 501b with trench 507b, channel stopper region 515 is formed in the region under trench 507b, and at the same time, channel stopper region 515 is formed in p$^-$ silicon substrate 521. Thus, the pn junction will not be formed between p$^+$ channel stopper region 515 and a substrate. This also prevents generation of the parasitic capacitance by virtue of p$^+$ channel stopper region 515, so that the high speed operation of the bipolar transistor can be maintained.

Further, p$^+$ channel stopper region 515 is formed in the region under trench 507b, so as to secure a large distance between p$^+$ channel stopper region 515 and an element (e.g., the bipolar transistor) formed on the surface of the substrate. In this regard, even if the pn junction is formed between p$^+$ channel stopper region 515 and the substrate to generate the parasitic capacitance, influence of such parasitic capacitance on the elements formed on the surface of the substrate can be diminished. This improves the electrical isolation effect between respective elements and keeps the high speed operation of the bipolar transistor.

In the meantime, there are problems in the conventional element isolation structure, apart from the above described advantages.

In the conventional method of manufacturing the semiconductor device, as shown in FIG. 55, silicon nitride film 503 and silicon oxide film 505 are formed stacked successively after formation of element isolation oxide film 501b. Silicon oxide film 505 serves as the etching stopper during etching back of polycrystalline silicon film 517 in the step, shown in FIGS. 60 and 61. Silicon nitride film 503 prevents the entry of oxidation species into the lower layers, such as n⁻ epitaxial growth layer 525 during thermal oxidation at the time of formation of silicon oxide film 519, so as to prevent oxidation of the lower layers in the steps shown in FIGS. 62 and 63.

The surface roughness of the internal wall of trench 507b is removed in the steps shown in FIGS. 57 and 58 after formation of silicon nitride film 503 and silicon oxide film 505. In other words, silicon oxide film 511 is removed by wet etching only after silicon oxide film 511 is once formed in trench 507b.

Supposing the element isolation structure is formed without removing the roughness in trench 507b, electrons and the like would easily move in the direction of arrow B along the roughness of trench 507b, as shown in FIG. 65. If electrons and the like can move easily across the element isolation region between adjacent elements, the electrical isolation capability between elements will be decreased significantly. In this regard, it is necessary to remove the roughness in trench 507b in order to prevent the decrease of the electrical isolation capability between elements.

Since, however, wet etching of silicon oxide film 511 shown in FIGS. 57 and 58 is carried out isotropically, element isolation oxide film 501b exposed from through hole 507a is simultaneously removed to a certain extent.

Referring to FIG. 58, a diameter $W_A$ of through hole 507a becomes wider than a diameter $W_B$ of silicon nitride film 503 due to isotropic etching of element isolation oxide film 501b. With this geometry, polycrystalline silicon layer 517 is formed by the CVD method or the like so as to fill trench 507b to obtain a sectional view shown in FIG. 66.

More specifically with reference to FIG. 66, polycrystalline silicon film 517 is formed on the entire surface to have an approximately uniform thickness by the CVD method. In other words, polycrystalline silicon film 517 is formed to reflect the stepped structure of the sidewalls of element isolation oxide film 501b and silicon nitride film 503. As a result, opening 507c is filled up before through hole 507a is completely filled, thus generating a void 517b in through hole 507a. Polycrystalline silicon film 517 is then etched back with void 517b generated to obtain a sectional view shown in FIG. 67.

Referring to FIG. 67, such a void leads to generation of a concave portion 517c in the upper surface of filling layer 517a formed by etching of polycrystalline silicon film 517. Accordingly, if oxide film 519 is formed on filling layer 517a, another concave portion 519c is generated on the surface of silicon oxide film 519 as shown in FIG. 68.

When patterning the conductive layer on the substrate with concave portion 519c on silicon oxide film 519, residue of the conductive layer will be generated in concave portion 519c.

FIG. 69 is a schematic sectional view showing the residue generated in such a concave portion, the view corresponding to the regions including the bipolar region and element isolation region shown in FIG. 51. FIG. 70 is a schematic plan view viewed from the direction of arrow C in FIG. 69. A sectional view taken along line A—A in FIG. 70 corresponds to FIG. 69.

With reference to FIGS. 69 and 70, in order to form, for example, conductive layer 535 for extracting the base electrode, the conductive layer is formed on the entire surface of the substrate, and then anisotropically etched for patterning. In the anisotropic etching, the residue is easily generated on the stepped sidewalls. Thus, a residue 535r of conductive layer 535 is generated along concave portion 519c.

In this case, the adjacent conductive layers are short-circuited because of residue 535r. More specifically, conductive layers 535a and 535b for extracting base electrode in the bipolar transistor, which are adjacent across the element isolation region, are short-circuited.

Therefore, in the conventional element isolation structure of the semiconductor device, respective conductive layers are short-circuited due to the residue left within concave portions.

SUMMARY OF THE INVENTION

An object of the present invention is to provide a semiconductor device having a high electrical isolation capability and an enhanced electrical reliability so that short circuit of individual conductive layers can be avoided, and the present invention also provides a method of manufacturing such a semiconductor device.

A method of manufacturing a semiconductor device according to one aspect of the present invention including an element isolation structure consisting of a combination of a trench isolation and an oxide film isolation includes the following steps.

First, an element isolation oxide film is formed on the main surface of a silicon substrate. A through hole penetrating through the element isolation oxide film to reach the main surface of the silicon substrate is formed. A covering layer for covering the wall of the through hole is formed such that a part of the surface of the silicon substrate is exposed at the bottom of the through hole. Then, the silicon substrate exposed from the covering layer at the bottom of the through hole is etched, so that a trench leading to the through hole is formed in the silicon substrate. After a silicon oxide film is formed on the internal wall of the trench by oxidation, the silicon oxide film is removed by isotropic etching. Then a first insulating layer is formed to cover the internal wall of the trench. A filling layer is formed to fill the trench such that the upper surface of the filling layer is located within the through hole. Then, a second insulating film is formed on the filling layer.

In such a method of manufacturing the semiconductor device according to one aspect of the present invention, the roughness within the trench is removed after the covering layer is formed to cover the wall made of the element isolation oxide film in the through hole. In other words, the silicon oxide film formed to cover the internal wall of the trench is removed with the covering layer formed. Thus, even if the silicon oxide film is removed by isotropic etching, the element isolation oxide film is not subjected to etching, since the element isolation oxide film is protected by the covering layer. Accordingly, a diameter of the through hole is not increased by the etching, so that generation of a void due to the increase of the diameter can be prevented. Further, generation of a concave portion due to such a void in the upper surface of the filling layer which fills the trench can be avoided.

A method of manufacturing a semiconductor device according to another aspect of the present invention including an element isolation structure constituting of a combination of a trench isolation and an oxide film isolation includes the following steps.

First, an element isolation oxide film is formed on the main surface of a silicon substrate. A protection layer which has an opening reaching the element isolation oxide film and includes a layer having an under etching characteristic different from that of the silicon oxide film is formed on the element isolation oxide film. A through hole penetrating through the element isolation oxide film to reach the main surface of the silicon substrate is formed. Then, the main surface of the silicon substrate exposed at the bottom of the through hole is etched to form a trench leading to the through hole is formed in the silicon substrate. After the silicon oxide film is formed on the internal wall of the trench by oxidation, the silicon oxide film is removed by isotropic etching. Then, a first insulating layer is formed to cover the internal wall of the trench. A covering layer for covering the wall of the through hole is formed such that a diameter of the through hole is substantially equal to a diameter of the opening. A filling layer is formed to fill the trench such that the top surface of the filling layer is located within the through hole. Then, a second insulating layer is formed on the filling layer.

In such a method of manufacturing the semiconductor device according to another aspect of the present invention, the wall of the element isolation oxide film within the through hole is etched by the etching of the silicon oxide film for removing the roughness of the internal wall of the trench. Thus, the diameter of the through hole becomes larger than the diameter of opening of the protection film. After that, however, the covering layer is formed to cover the wall of the element isolation oxide film, so that the diameter of through hole can be made substantially equal to the diameter of opening of the protection film. Therefore, generation of a void due to the diameter of through hole being larger than the diameter of opening of the protection film can be prevented. Further, generation of a concave portion due to such a void in the upper surface of the filling layer which fills the trench can be avoided.

A semiconductor device according to the present invention includes an element isolation structure consisting of a combination of a trench isolation and an oxide film isolation, wherein a silicon substrate, an element isolation oxide film, a first insulating layer, a covering layer, a filling layer, and a second insulating layer are provided. The silicon substrate includes the main surface wherein a trench is provided. The element isolation oxide film is formed on the main surface of the silicon substrate, and has a through hole leading to the trench. The first insulating layer is provided to cover the internal wall of the trench. The covering layer is formed only in the through hole so as to cover at least an end wall on the trench side of the through hole. The filling layer is provided for filling the trench, and the top surface of the filling layer is located within the through hole. The second insulating layer is formed on the filling layer so as to fill the through hole.

In the semiconductor device according to the present invention which is manufactured by either of the above described two aspects, the generation of the concave portion due to the void in the upper surface of the filling layer which fills the trench is prevented. Therefore, when patterning a conductive layer on the substrate, a residue will not be generated in such a concave portion. This prevents short circuit of individual conductive layers because of the residue. As a result, such a semiconductor device which is electrically highly reliable can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of a semiconductor device having an element isolation structure of the present invention will be described below.

EMBODIMENT 1

Figure 1:
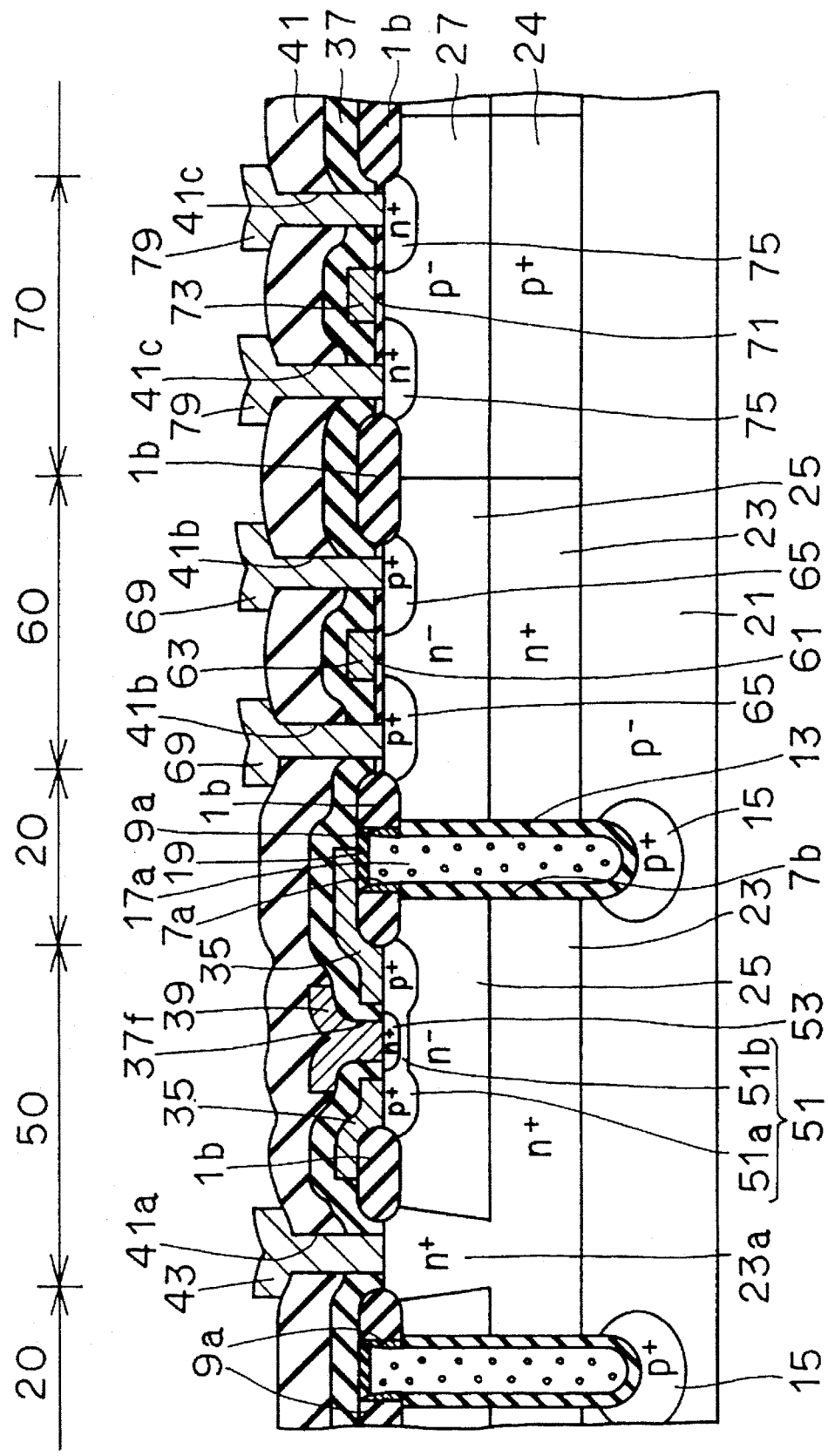
FIG. 1 is a sectional view-of a Bi-CMOS structure schematically showing a structure of semiconductor device according to a first embodiment of the present invention.

With reference to FIG. 1, a Bi-CMOS structure includes a bipolar transistor region 50, a pMOS transistor region 60, an nMOS transistor region 70, and an element isolation region 20.

Element isolation region 20 is provided mainly for electrically isolating bipolar transistor region 50 from CMOS transistor regions 60, 70.

First, in bipolar transistor region 50, an n$^+$ buried layer 23 is formed on the surface of a p$^-$ silicon substrate 21. An n$^+$ collector wall region 23a and an n$^-$ epitaxial growth layer 25 are formed on the surface of n$^+$ buried layer 23. An element isolation oxide film 1b is formed on the surface of a silicon substrate 1 where n$^+$ collector wall region 23a interfaces with n$^-$ epitaxial growth layer 25.

A base region 51 and an n⁺ emitter region 53 are formed on the surface of n⁻ epitaxial growth layer 25. Base region 51 is provided so as to surround the periphery of n⁺ emitter region. Also, base region 51 is formed by a two-layered structure consisting of a p⁺ base region 51a and a p type base region 51b.

A conductive layer 35 for extracting a base region is formed into a desired shape so as to be in contact with the surface of base region 51. An insulating layer 37 is formed to cover the surface of conductive layer 35. A conductive layer 39 for extracting an emitter electrode is formed so as to be in contact with n⁺ emitter electrode region 53 via a contact hole 37f provided in insulating layer 37. An insulating layer 41 is provided to cover the surface of conductive layer 39 for extracting the emitter electrode. A conductive layer 43 for extracting the collector electrode is formed so as to be in contact with n⁺ collector wall region 23a via a contact hole 41a which penetrates through two insulating layers 41, 37.

Next, in pMOS transistor region 60, n⁺ buried layer 23 is formed on the surface of p⁻ silicon substrate 21. n⁻ epitaxial growth layer 25 is formed on the surface of n⁺ buried layer 23. Thus, the pMOS transistor is formed on the surface of n⁻ epitaxial growth layer 25.

The pMOS transistor includes a gate oxide film 61, a gate electrode 63, and a pair of p⁺ source/drain regions 65, 65. The pair of p⁺ source/drain regions 65, 65 are formed to face with each other across a predetermined distance provided therebetween on the surface of n⁻ epitaxial growth layer 25. Gate electrode 63 is formed in a region sandwiched by the pair of p⁺ source/drain regions with gate oxide film 61 interposed therebetween.

Insulating layers 37, 41 are formed stacked successively so as to cover the pMOS transistor. A contact hole 41b which penetrates through two insulating layers 37, 41 to reach a part of the surface of the pair of p⁺ source/drain regions is formed in insulating layers 37, 41. A conductive layer 69 is formed on insulating layer 41 so as to be in contact with p⁺ source/drain regions 65, 65 via contact hole 41b.

Next, in nMOS transistor region 70, a p⁺ buried layer 24 is formed on the surface of p⁻ silicon substrate 21. A p type region 27 formed by selectively implanting ions is provided on the surface of p⁺ buried layer 24. The nMOS transistor is formed on the surface of p type region 27.

The nMOS transistor includes a gate oxide film 71, a gate electrode 73, and a pair of n⁺ source/drain regions 75, 75 The pair of n⁺ source/drain regions 75, 75 are formed to face with each other across a predetermined distance provided therebetween on the surface of p type region 27 formed by selective ion implantation. Gate electrode 73 is formed on a region sandwiched by the pair of n⁺ source/drain regions with gate oxide film 71 interposed therebetween.

Insulating layers 37, 41 are formed to cover the nMOS transistor. A contact hole 41c which penetrates through two insulating layers 37, 41 to reach the pair of n⁺ source/drain regions 75, 75 is formed in insulating layers 37, 41. A conductive layer 79 contacting n⁺ source/drain regions 75, 75 via contact hole 41c is formed on insulating layer 41.

In the meantime, n⁺ buried layer 23 and n⁻ epitaxial growth layer 25 are stacked successively on p⁻ silicon substrate 21 in element isolation region 20. Element isolation oxide film 1b is formed on the surface of n⁻ epitaxial growth layer 25. A through hole 7a which penetrates through element isolation oxide film 1b to reach the surface of n⁻ epitaxial growth layer 25 is provided in element isolation oxide film 1b.

A covering layer 9a is formed to cover the sidewall of through hole 7a. Covering layer 9a is in the shape of a sidewall spacer, and is made of, for example, a silicon nitride film. A trench 7b is formed under and in communication with through hole 7a.

Trench 7b penetrates through n⁻ epitaxial growth layer 25 and n⁺ buried layer 23 to reach a predetermined depth of p⁻ silicon substrate 21. A first insulating layer 13 having a predetermined thickness is formed to cover the internal wall of trench 7b. First insulating layer 13 is made of, for example, a silicon oxide film.

A filling layer 17a is formed to fill trench 7b so that the top surface of filling layer 17a is located within through hole 7a. Filling layer 17a is made of, for example, polycrystalline silicon without any impurity introduced therein. A second insulating layer 19 is formed on filling layer 17a to fill up through hole 7a. Second insulating layer 19 is made of, for example, a silicon oxide film.

It is noted that a p⁺ channel stopper region 15 is formed in a region under trench 7b in p⁻ silicon substrate 21, so that the element isolation effect can be further improved.

Now, a method of manufacturing a semiconductor device having an element isolation structure according to a first embodiment of the present invention will be described below.

Figure 2:
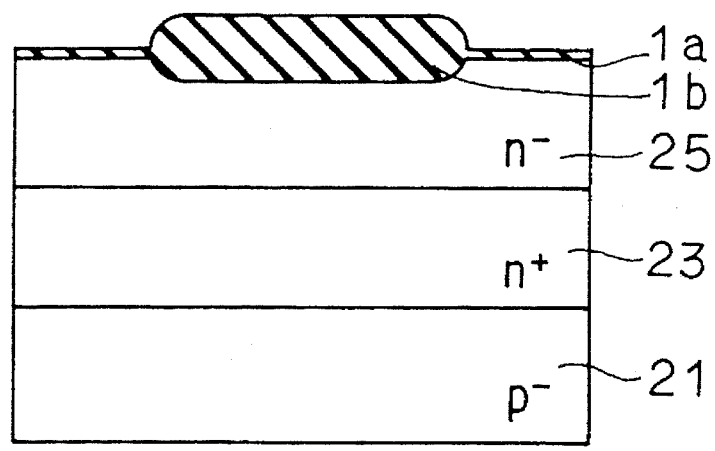
FIGS. 2–15 are sectional views schematically showing in this order a method of manufacturing the semiconductor device according to the first embodiment of the present invention.

Referring to FIG. 2, n⁺ buried layer 23 and n⁻ epitaxial growth layer 25 are stacked successively on p⁻ silicon substrate 21. Boron (B) is introduced into p⁻ silicon substrate 21 to obtain a concentration of $5 \times 10^{14}/cm^3$. Also, antimony (Sb) is introduced into n⁺ buried layer 23 to obtain a concentration of $10^{20}/cm^3$. Phosphorus (P) is introduced into n⁻ epitaxial growth layer 25 to obtain a concentration of $5 \times 10^{15}/cm^3$. Silicon oxide film 1a is formed by thermal oxidation or the like on the surface of n⁻ epitaxial growth layer 25. Then, element isolation oxide film 1b is formed selectively at a thickness of about 5000 Å by a commonly used LOCOS method.

Figure 3:
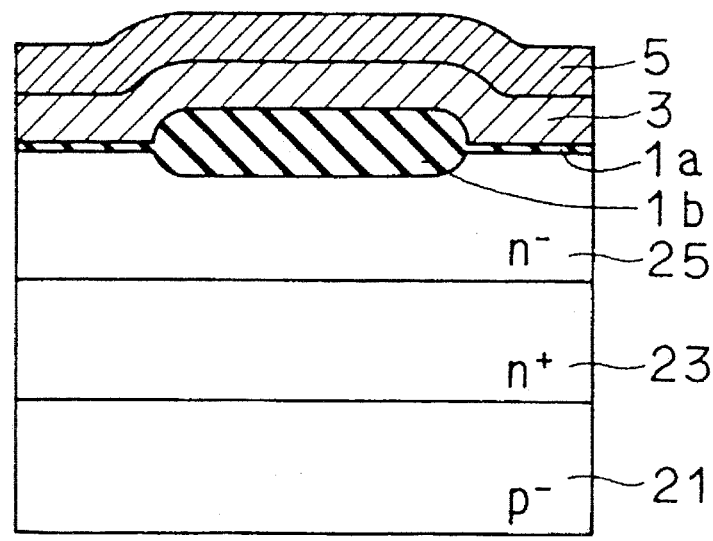

Referring to FIG. 3, a silicon nitride film ($Si_3N_4$) 3 is formed on the entire surface of n⁻ epitaxial growth layer 25 with a thickness of about 200–500 Å by the CVD method. A silicon oxide film ($SiO_2$) 5 is formed on the entire surface of silicon nitride film 3 with a thickness of about 6000–8000 Å by the CVD method.

Figure 4:
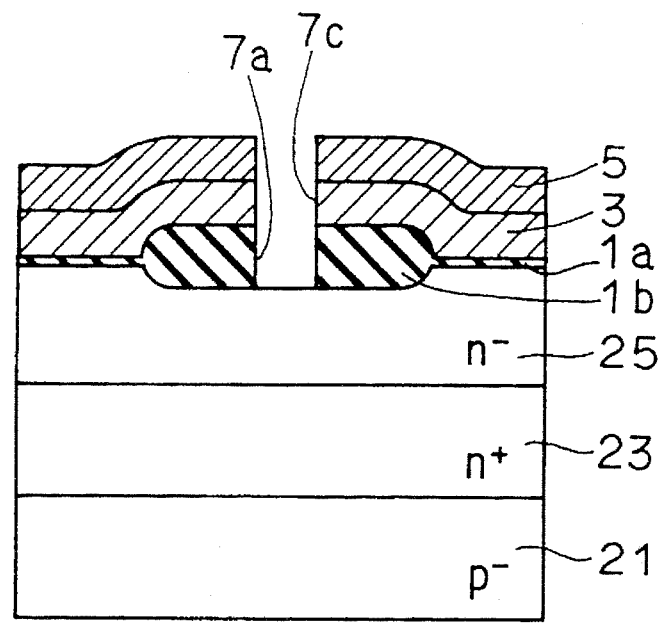

Referring to FIG. 4, an opening 7c which penetrates two layers of silicon nitride film 3 and silicon oxide film 5 is formed by photolithography, the RIE method or the like. Then, element isolation oxide film 1b exposed at the bottom wall of opening 7c is anisotropically etched to form through hole 7a which penetrates through element isolation oxide film 1b to reach the surface of n⁻ epitaxial growth layer 25. A diameter of through hole 7a is substantially equal to a diameter of opening 7c, and such a diameter is, for example, 0.8 μm.

Figure 5:
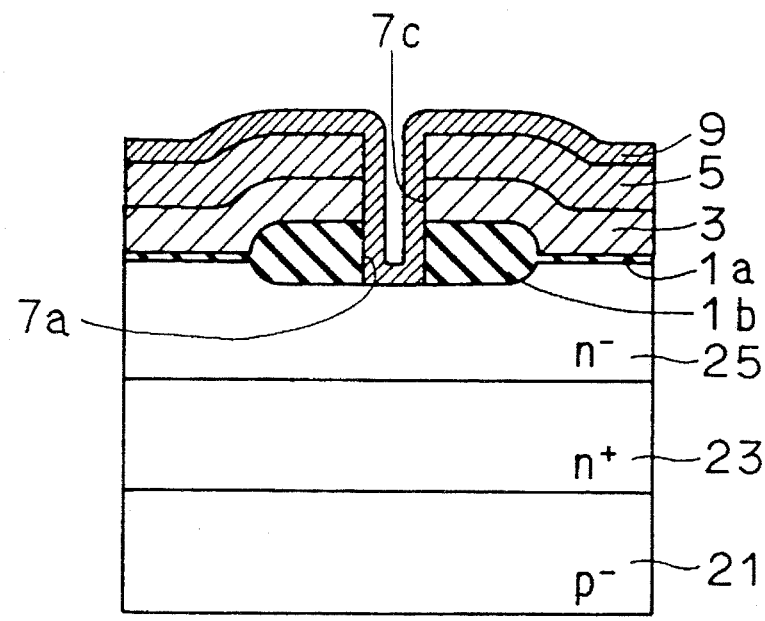

Referring to FIG. 5, a silicon nitride film 9 is formed on the entire surface of silicon oxide film 5 to have a thickness of about 1000 Å by the CVD method so as to cover the internal wall of opening 7c and through hole 7a. Silicon nitride film 9 is subjected to anisotropic etching under a predetermined condition.

Figure 6:
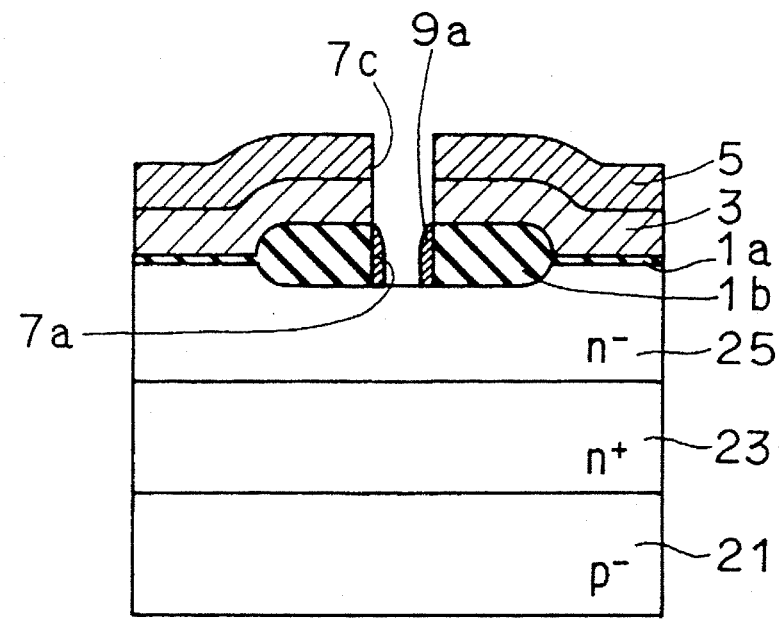

Referring to FIG. 6, covering layer 9a is formed by the above anisotropic etching so as to cover the sidewall of through hole 7a. Covering layer 9a is in the shape of sidewall spacer, and is made of a silicon nitride film. Using covering layer 9a as a mask, anisotropic etching is carried out to a part of n⁻ epitaxial growth layer 25 exposed at the bottom of through hole 7a.

Figure 7:
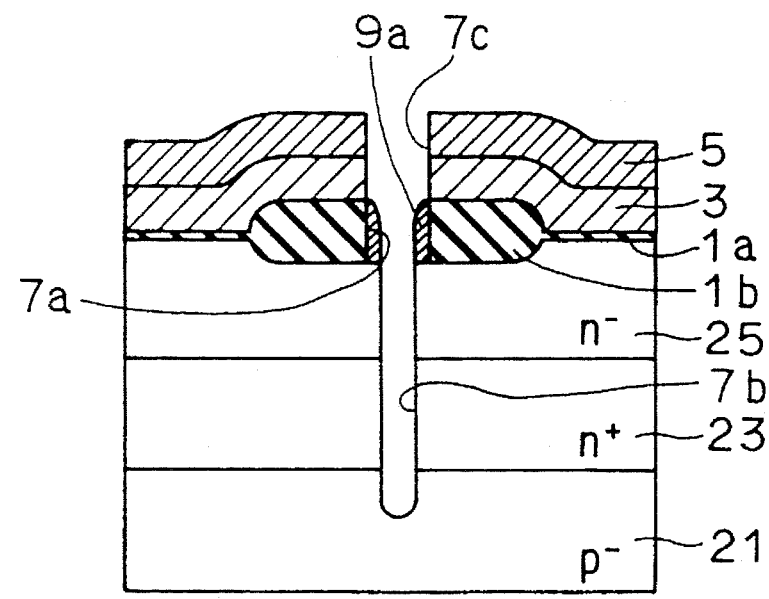

Referring to FIG. 7, trench 7b which penetrates through n⁻ epitaxial growth layer 25 and n⁺ buried layer 23 to reach a predetermined depth of p⁻ silicon substrate 21 is formed by the above etching. Then, wet oxidation is conducted at the temperature of 950° C. in an atmosphere of $O_2+H_2$.

Figure 8:
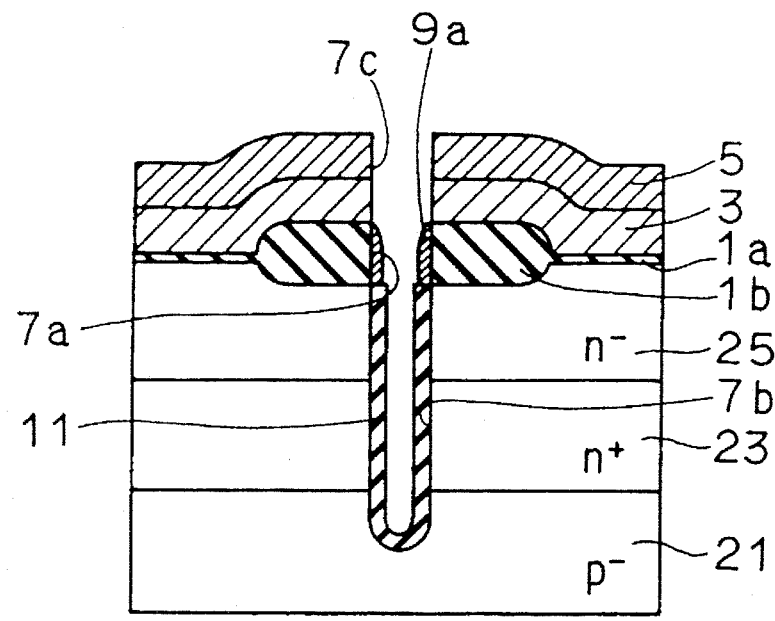

Referring to FIG. 8, the internal wall of trench 7b is oxidized by wet oxidation so that a silicon oxide film 11 covering the internal wall of trench 7b is formed to have a thickness of about 1000 Å. Silicon oxide film 11 is then removed by the processing using hydrofluoric acid (HF).

During the processing using hydrofluoric acid conducted for removing the roughness of the internal wall of trench 7b, the sidewall of element isolation oxide film 1b within through hole 7a is covered by covering layer 9a. Covering layer 9a is made of the silicon nitride film, so that in most cases covering layer 9a is prevented from being etched during the processing of the oxide film. Thus, element isolation oxide film 1b is not etched-away by the processing using hydrofluoric acid. In other words, covering layer 9a protects element isolation oxide film 1b.

Figure 9:
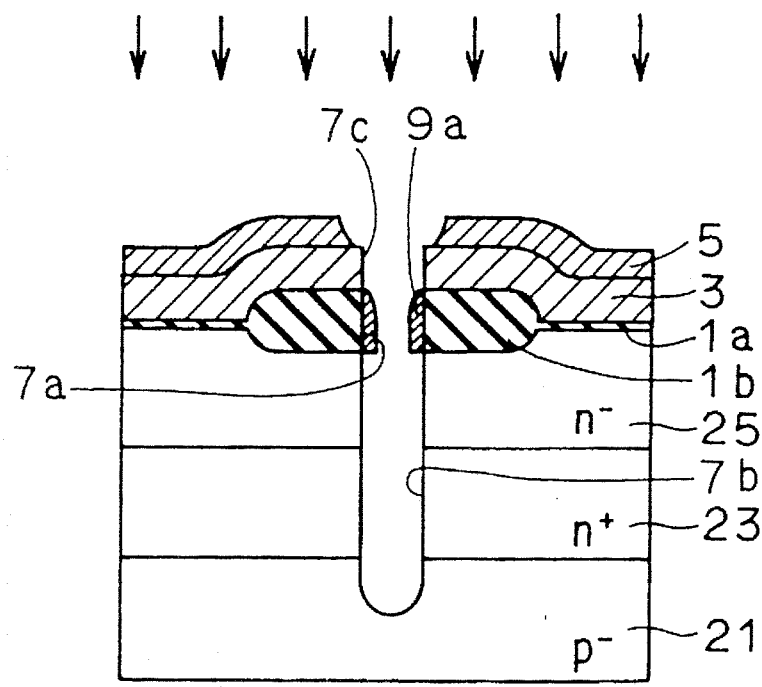

Referring to FIG. 9, the processing using hydrofluoric acid thus causes removal of silicon oxide film 11 within trench 7b. Then, boron ions ($B^+$) are implanted into the bottom portion of trench 7b at an acceleration voltage of 50 keV and a dosage of $10^{13}$–$10^{14}$/cm².

Figure 10:
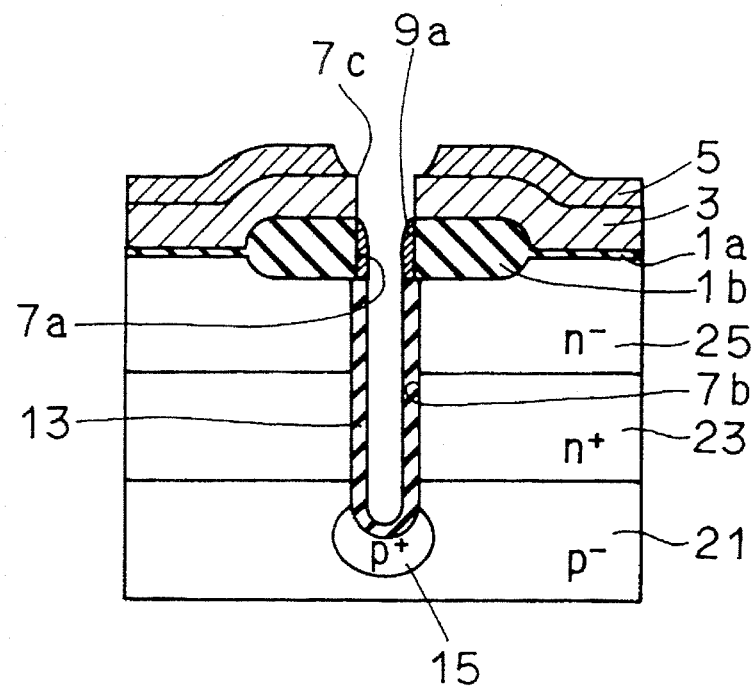

Referring to FIG. 10, wet oxidation is carried out again at a temperature of 950° C. in an atmosphere of $O_2+H_2$ so as to form first insulating layer 13 made of silicon oxide which covers the internal wall of trench 7b with a thickness of about 1000 Å. At the same time, p⁺ channel stopper region 15 is formed by activation/diffusion of the impurity introduced into the bottom portion of trench 7b caused by the oxidation.

Figure 11:
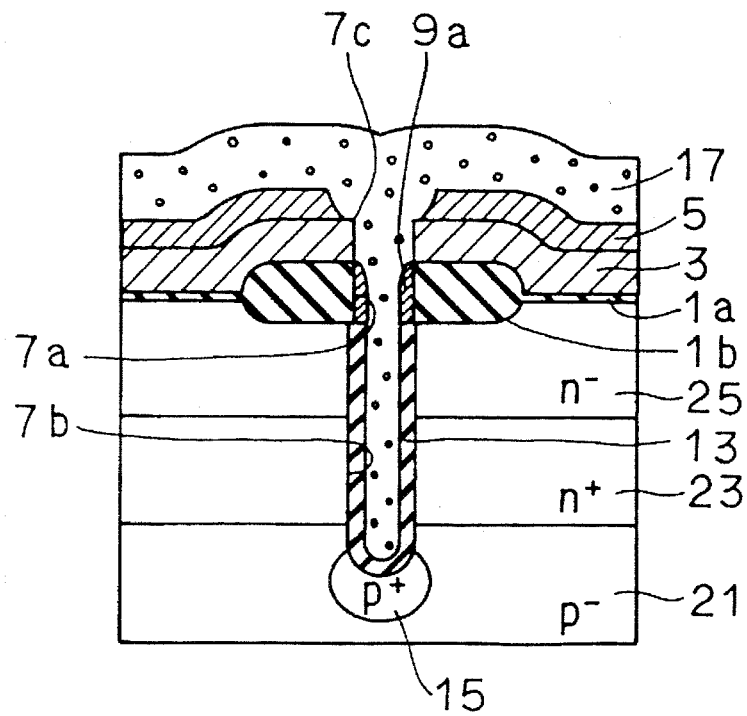

Referring to FIG. 11, a polycrystalline silicon layer 17 having a thickness of about 10000 Å is formed on the entire surface of silicon oxide film 5 by the CVD method so as to fill trench 7b, through hole 7a, and opening 7c. Polycrystalline silicon layer 17 is then etched back.

Figure 12:
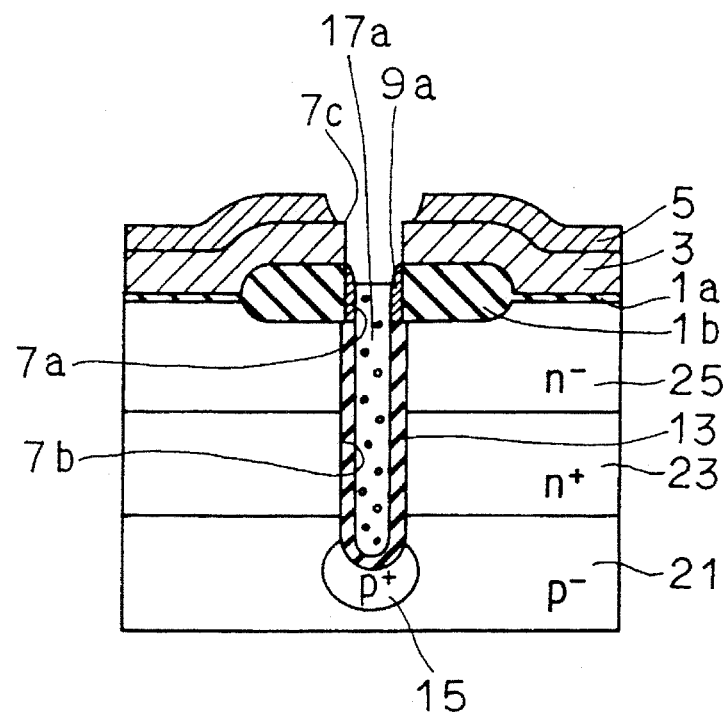

Referring to FIG. 12, by etching back, trench 7b is filled to form filling layer 17a made of polycrystalline silicon with the top surface thereof located within through hole 7a. During etching back, silicon oxide film 5 serves as an etching stopper. Silicon oxide film 5 is then removed.

Figure 13:
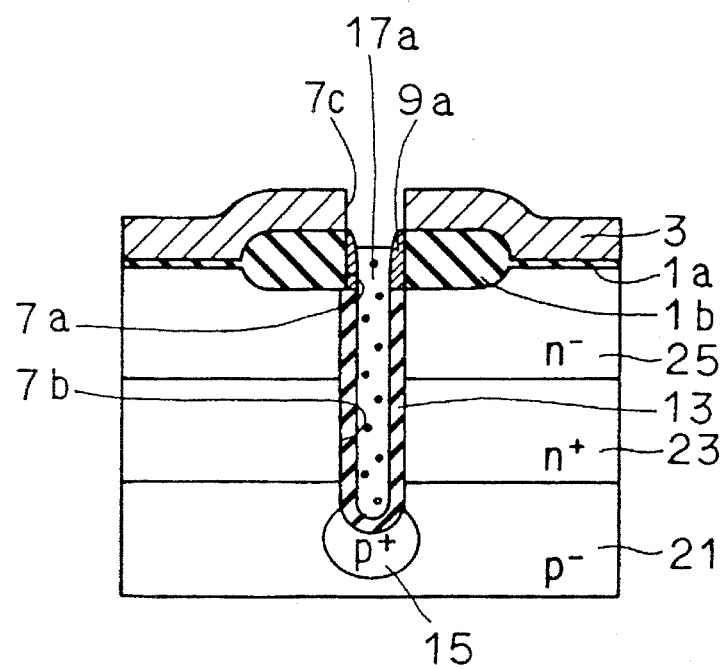

Referring to FIG. 13, the surface of silicon nitride film 3 is exposed after removal of silicon oxide film 5.

Figure 14:
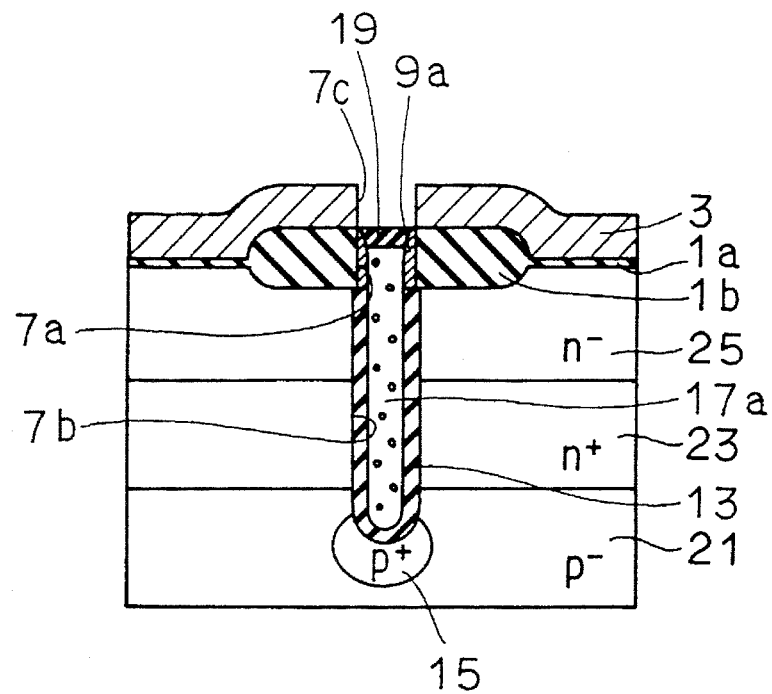
Figure 15:
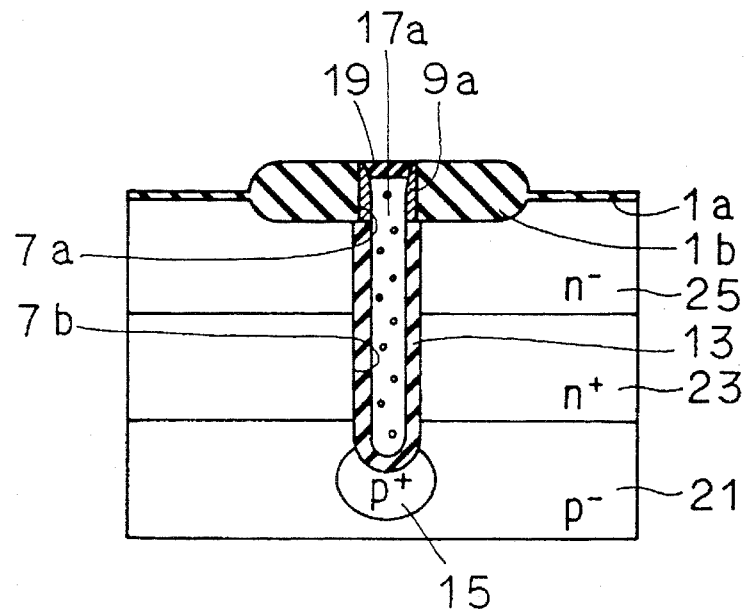

Referring to FIG. 14, thermal oxidation is carried out under a predetermined condition. Thus, second insulating layer 19 made of silicon oxide film is formed on filling layer 17a so as to fill up through hole 7a. During thermal oxidation, silicon nitride film 3 prevents introduction of oxidation species into the substrate side. Silicon nitride film 3 is then removed as shown in FIG. 15.

The thus formed element isolation structure in the semiconductor device of the first embodiment of the present invention can be used for isolating, for example, the bipolar transistor from the other elements. In this regard, a method of manufacturing the bipolar transistor wherein the element isolation structure of the present invention is used will be described below.

Figure 16:
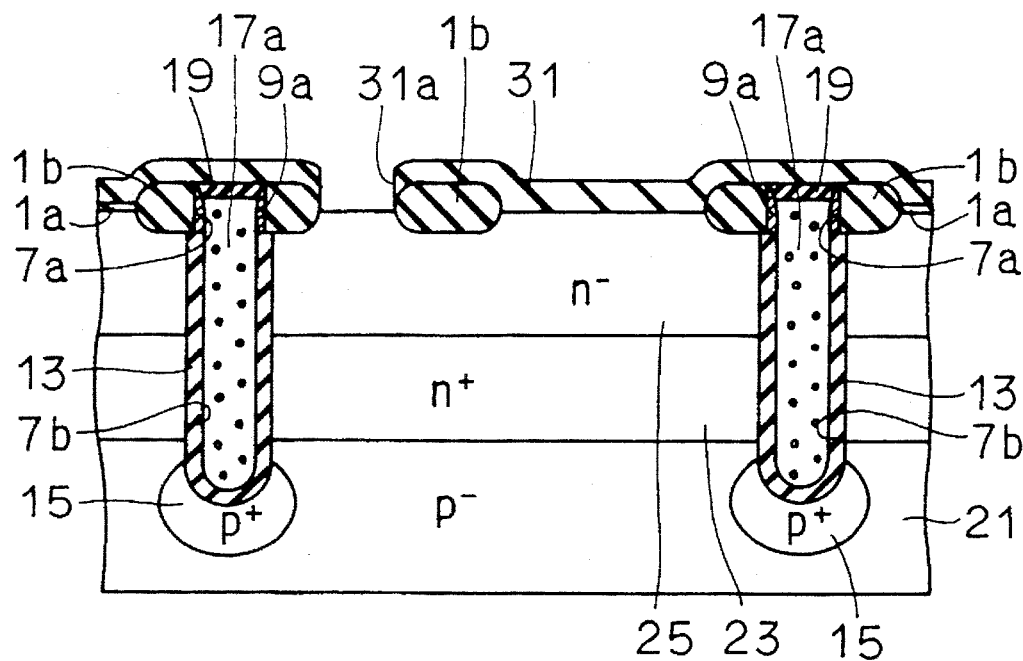
FIGS. 16–29 are sectional views schematically showing in this order a method of manufacturing a bipolar transistor employing an element isolation structure of the semiconductor device according to the first embodiment of the present invention.

First, referring to FIG. 16, the above described element isolation structure is formed to surround the bipolar transistor region on the silicon substrate consisting of p⁻ silicon substrate 21, n⁺ buried layer 23, and n⁻ epitaxial growth layer 25. Also provided in the bipolar transistor region is element isolation oxide film 1b formed by the usual LOCOS method. A silicon nitride film 31 is then formed to have a thickness of about 1000 Å by the CVD method, in which an opening 31a is provided.

Figure 17:
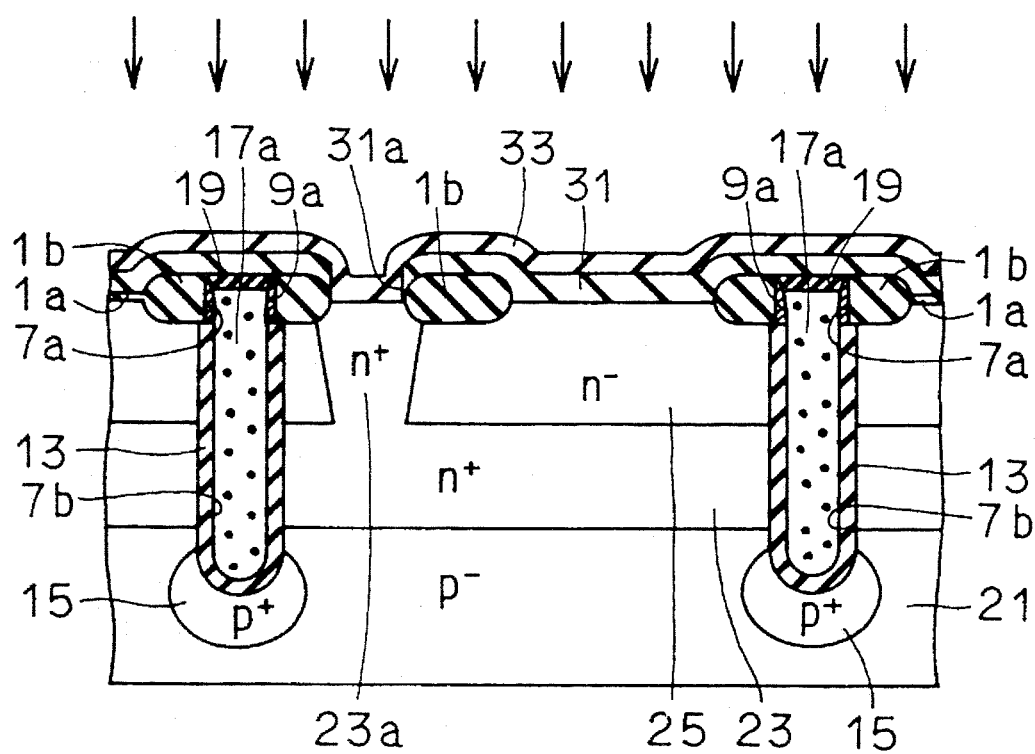
Figure 18:
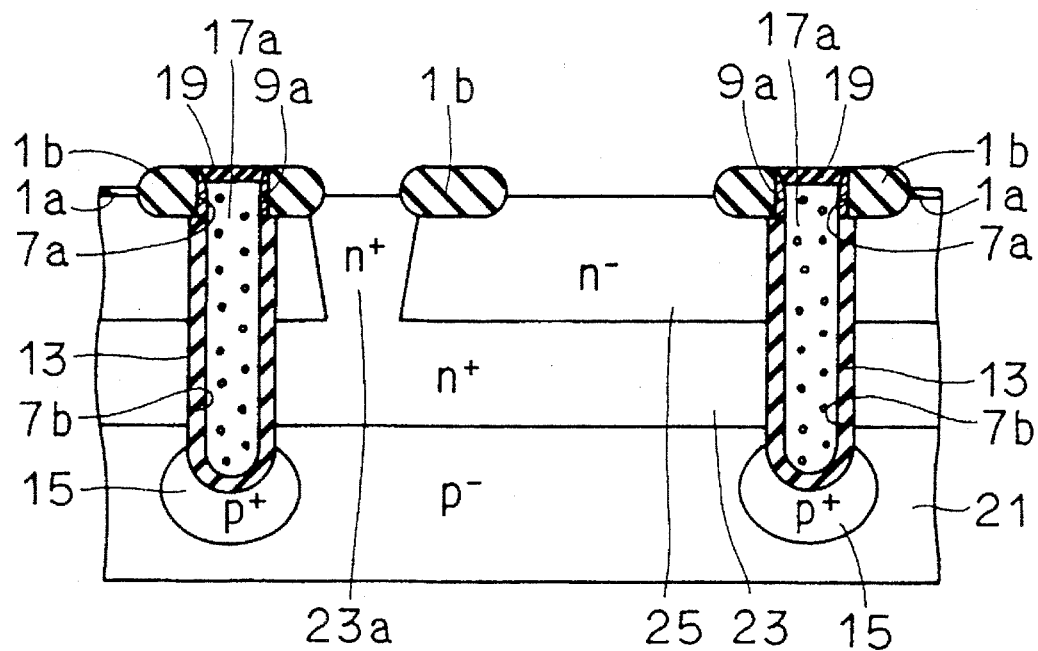

Referring to FIG. 17, a silicon oxide film 33 including $PH_3$ is formed on the entire surface of silicon nitride film 31 by the CVD method so as to be in contact with a part of the surface of n⁻ epitaxial growth layer 25 via opening 31a. Then, heat treatment is applied at a temperature of about 950° C. so that phosphorus (P) in silicon oxide film 33 is diffused into n⁻ epitaxial growth layer 25. Accordingly, n⁺ collector wall region 23a is formed within the region of n⁻ epitaxial growth layer 25. Silicon oxide film 33 and silicon nitride film 31 are removed successively as shown in FIG. 18.

Figure 19:
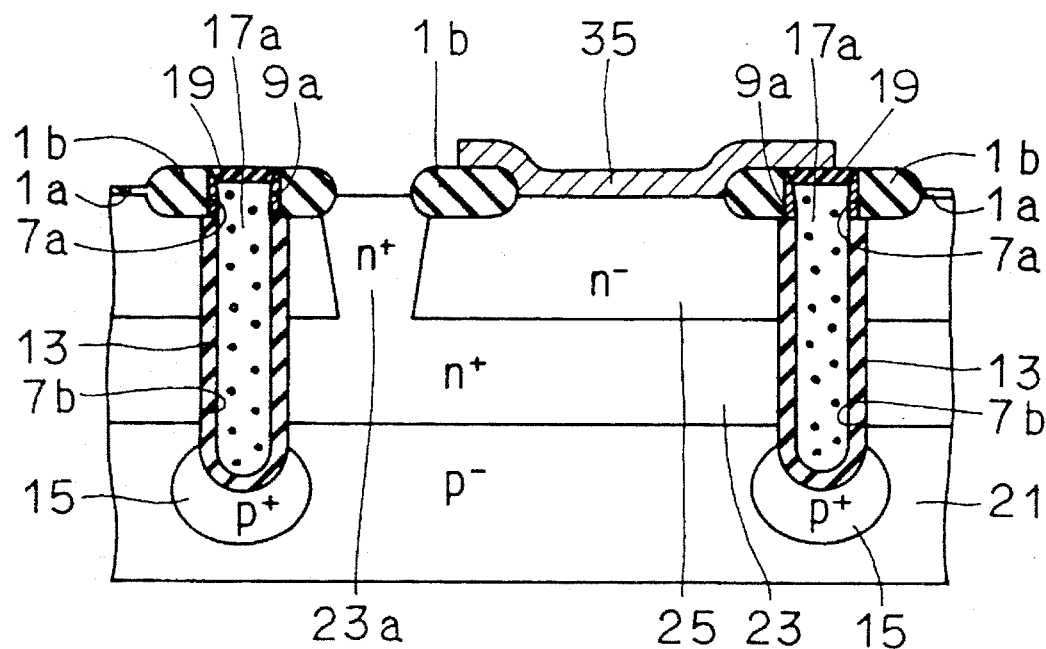

Referring to FIG. 19, a polycrystalline silicon layer 35 having a predetermined shape is formed to be in contact with the surface of n⁻ epitaxial growth layer 25. $BF_2$ ions are implanted into polycrystalline silicon layer 35 to form a so-called doped polycrystalline silicon layer.

Figure 20:
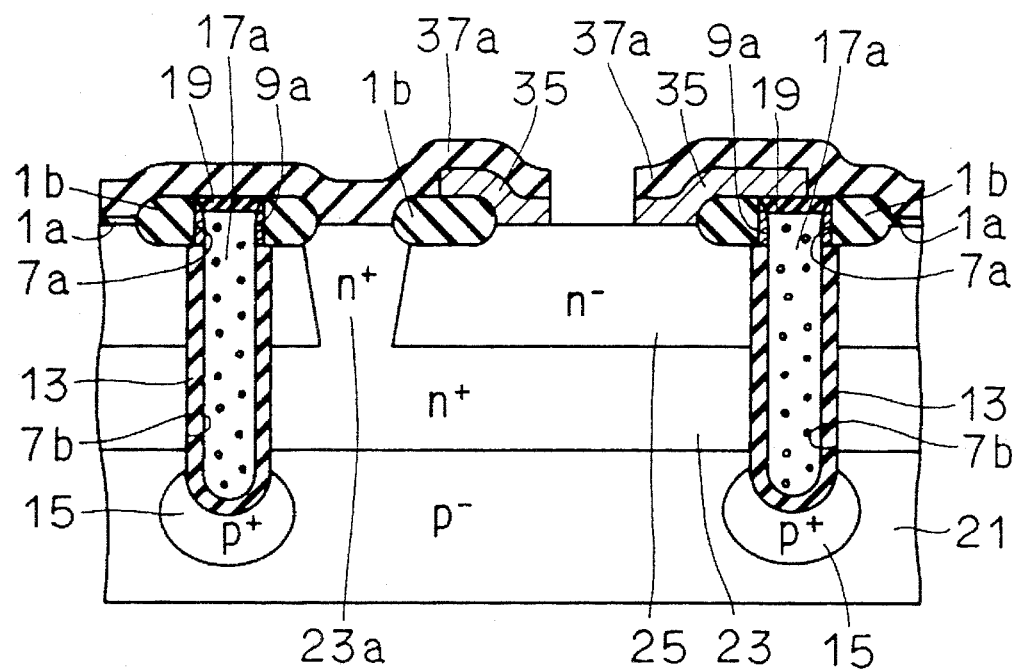

Referring to FIG. 20, an insulating layer 37a made of silicon oxide is formed on the entire surface of the substrate so as to cover doped polycrystalline silicon layer 35. Insulating layer 37a and doped polycrystalline silicon layer 35 are patterned into a predetermined shape by photolithography, RIE or the like. Thus patterned, conductive layer 35 for extracting the base electrode made of doped polycrystalline silicon can be formed. After that, thermal processing is carried out.

Figure 21:
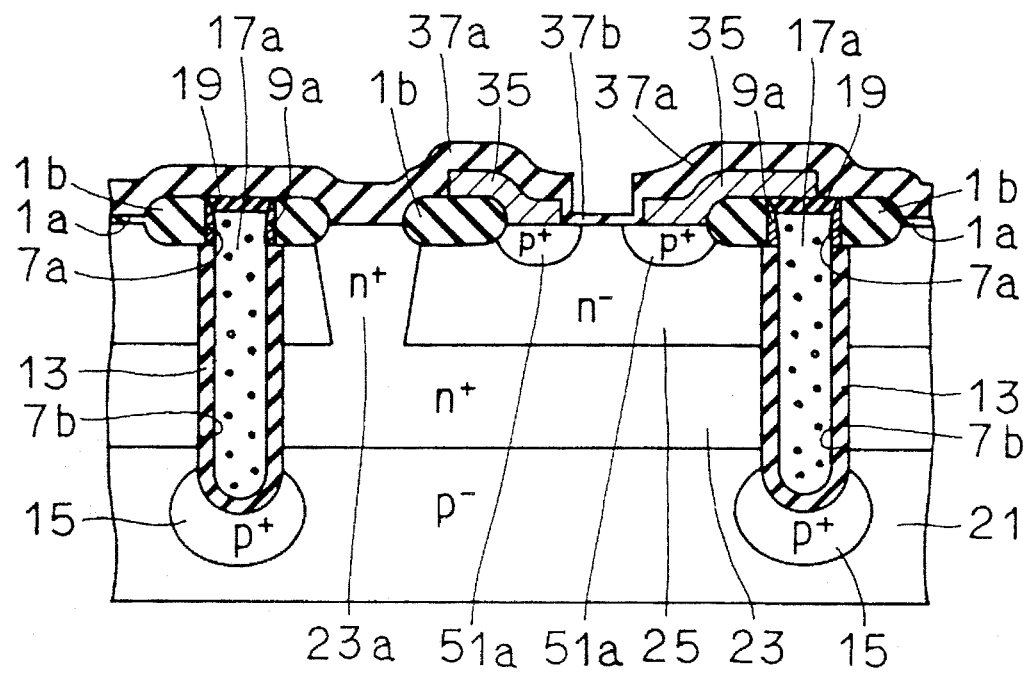

Referring to FIG. 21, boron (b) within conductive layer 35 for extracting base electrode is diffused into n⁻ epitaxial growth layer 25 by the thermal processing, so that the pair of p⁺ base regions 51a, 51a are formed in regions under conductive layer 35 for extracting base electrode. Also, both exposed surfaces of n⁻ epitaxial growth layer 25 and conductive layer 35 are oxidized by the thermal processing to form a thin silicon oxide film 37b.

Figure 22:
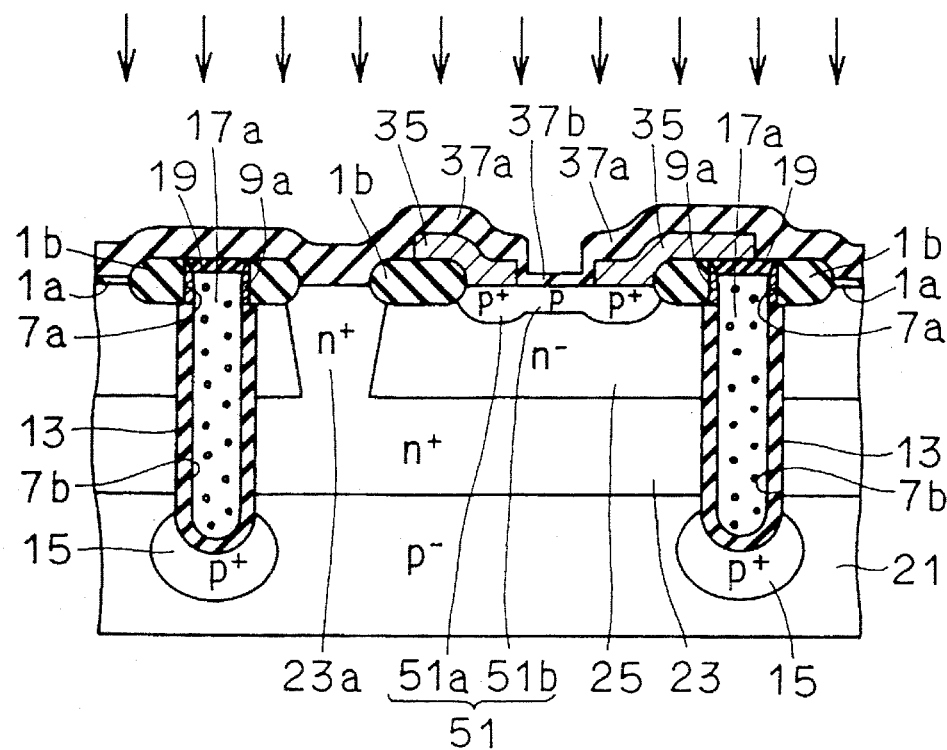

Referring to FIG. 22, $BF_2$ ions are implanted to form p type base region 51b in a region between the pair of p⁺ base regions 51a, 51a. Base region 51 is formed by P⁺ base region 51a and p type base region 51b. The concentration of impurity in p type base region 51b is set to be smaller than that of p⁺ base region 51a such that $h_{FE}$ (emitter ground current amplification factor) attains about 100.

Figure 23:
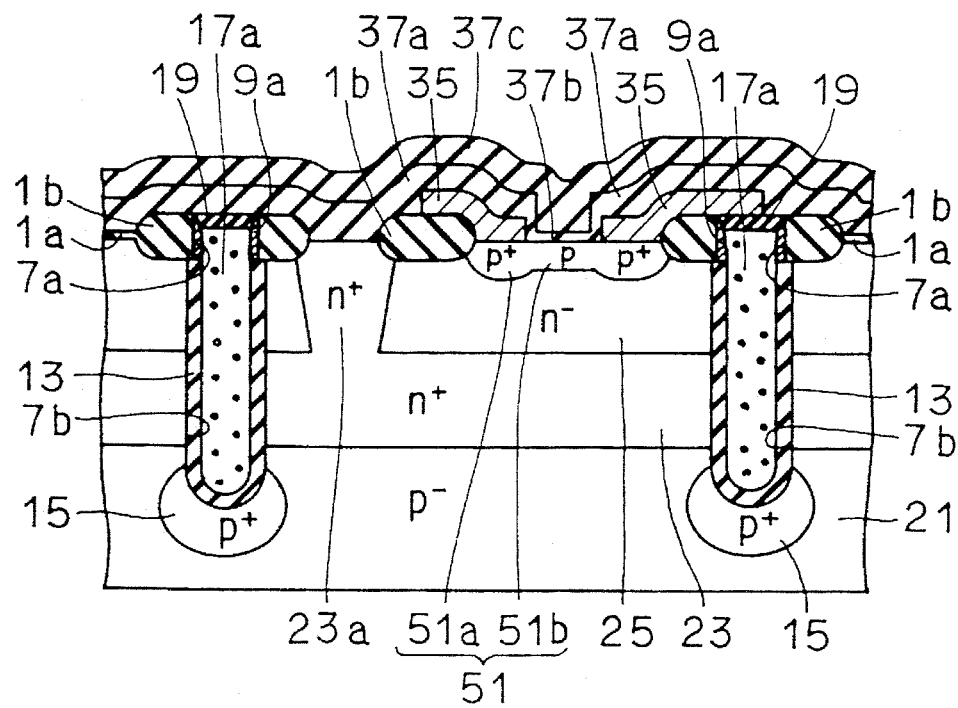

Referring to FIG. 23, a silicon oxide film 37c is formed on the entire surface of the substrate, and then the entire surface of silicon oxide film 37c is anisotropically etched.

Figure 24:
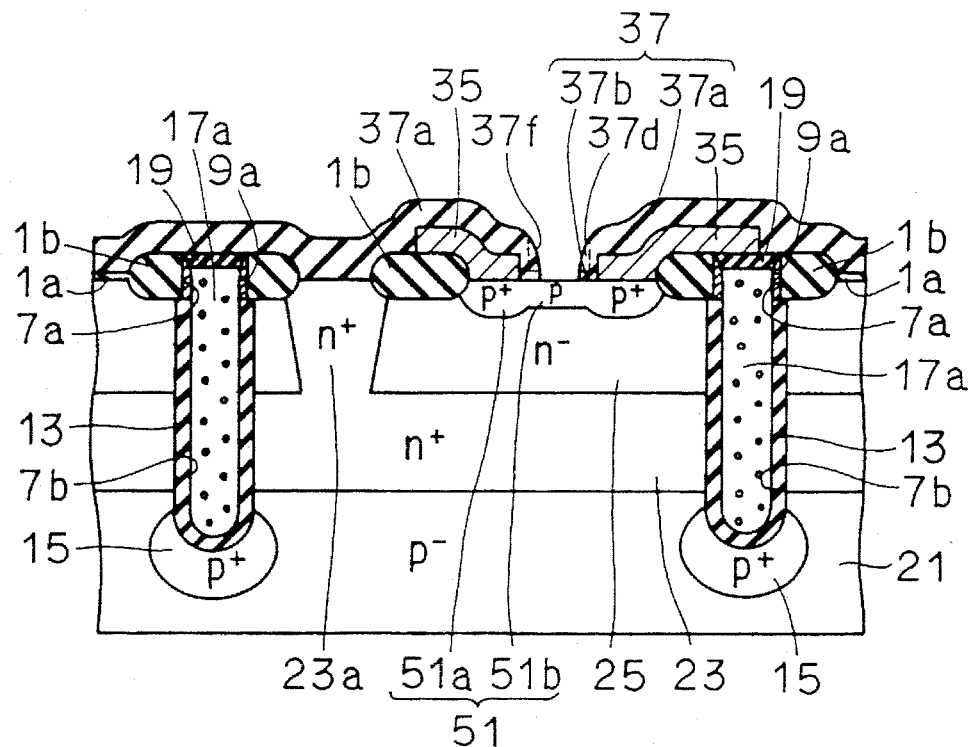

Referring to FIG. 24, contact hole 37f is thus formed by the etching to expose a part of the surface of p type base region 51b. At the same time, a frame portion 37d having a shape of a sidewall spacer is formed on the sidewall of silicon oxide film 37a by the etching so as to determine the shape of contact hole 37f. Those silicon oxide films 37a, 37b, 37d serve as insulating layer 37.

Figure 25:
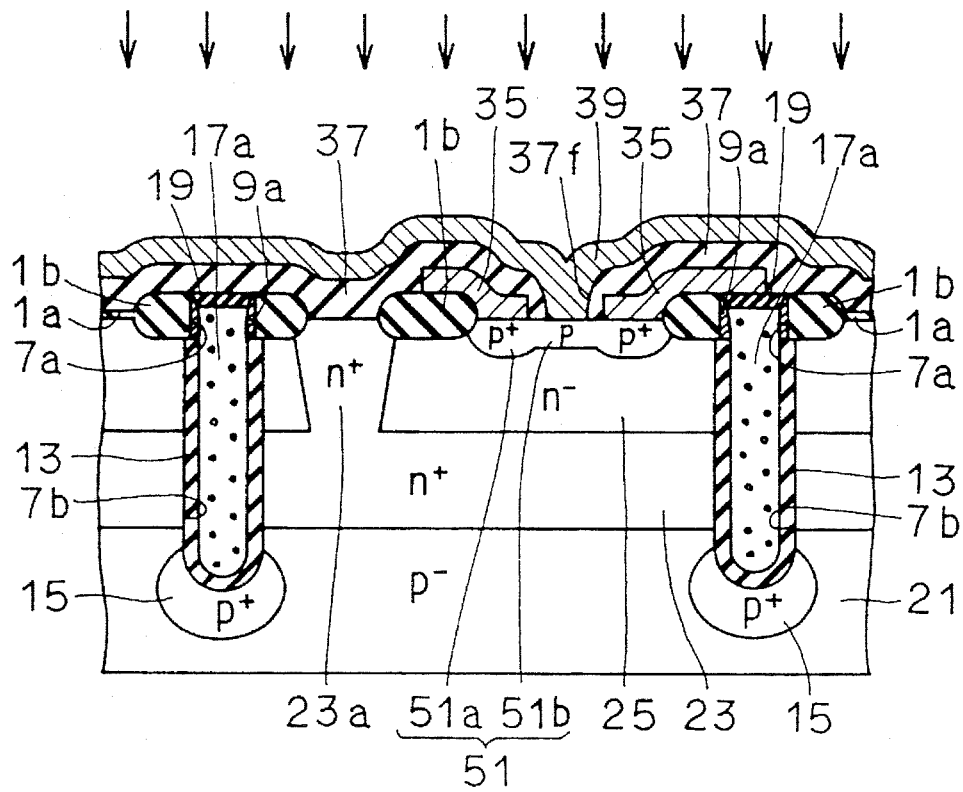

Referring to FIG. 25, polycrystalline silicon layer 39 is formed on the entire surface of insulating layer 37 so as to be in contact with the part of the surface of p type base region 51b via contact hole 37f. Arsenic (As) ions are implanted into polycrystalline silicon layer 39 to form a so-called doped polycrystalline silicon.

Figure 26:
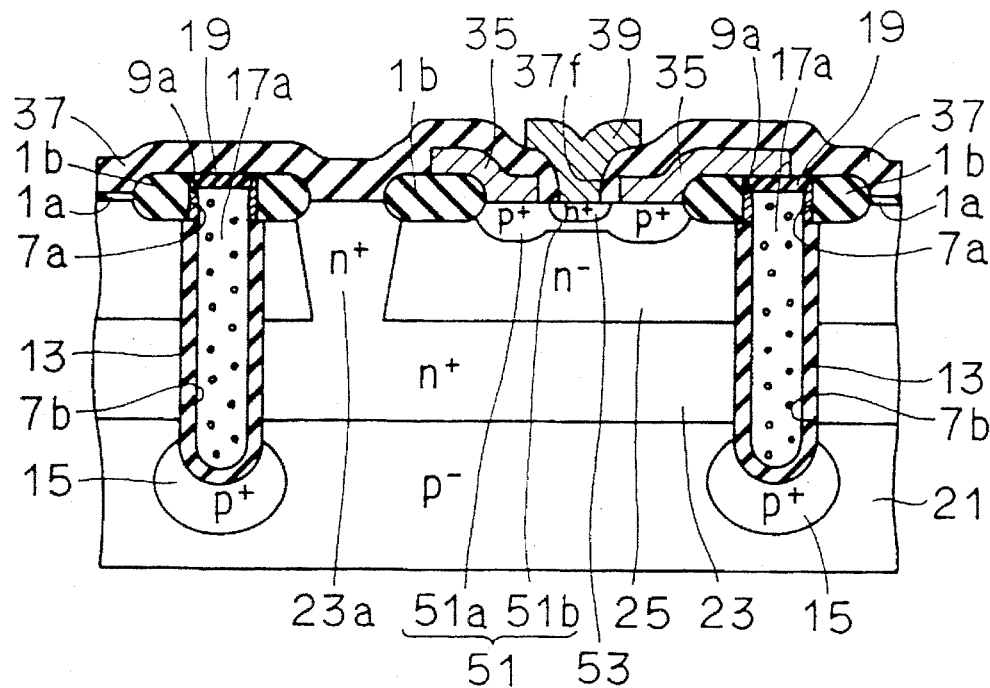

Referring to FIG. 26, doped polycrystalline silicon layer 39 is patterned into a desired shape by photolithography, RIE or the like. Then, arsenic (As) in doped polycrystalline silicon layer 39 is diffused into p type base region 51b by thermal processing, so that n⁺ emitter region 53 is formed within p type base region 51b. Thus, doped polycrystalline silicon layer 39 serves as conductive layer 39 for extracting emitter electrode connected to n⁺ emitter region 53.

Figure 27:
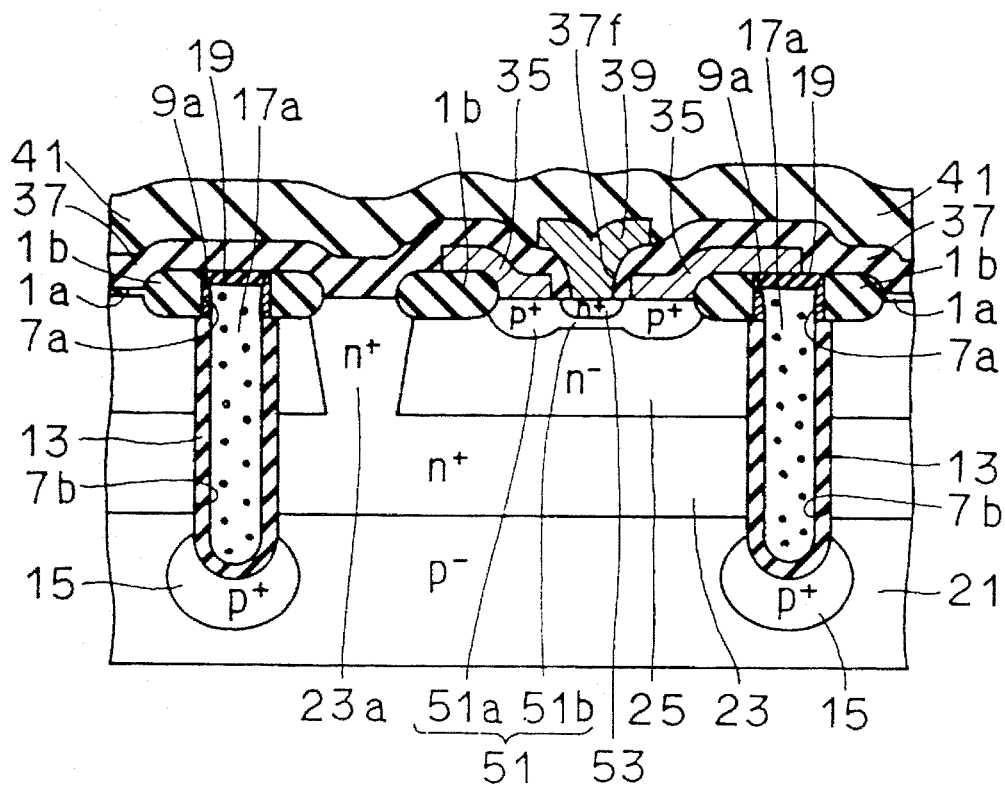

Referring to FIG. 27, insulating layer 41 made of silicon oxide is formed on the entire surface of insulating layer 37 so as to cover conductive layer 39 for extracting emitter electrode.

Figure 28:
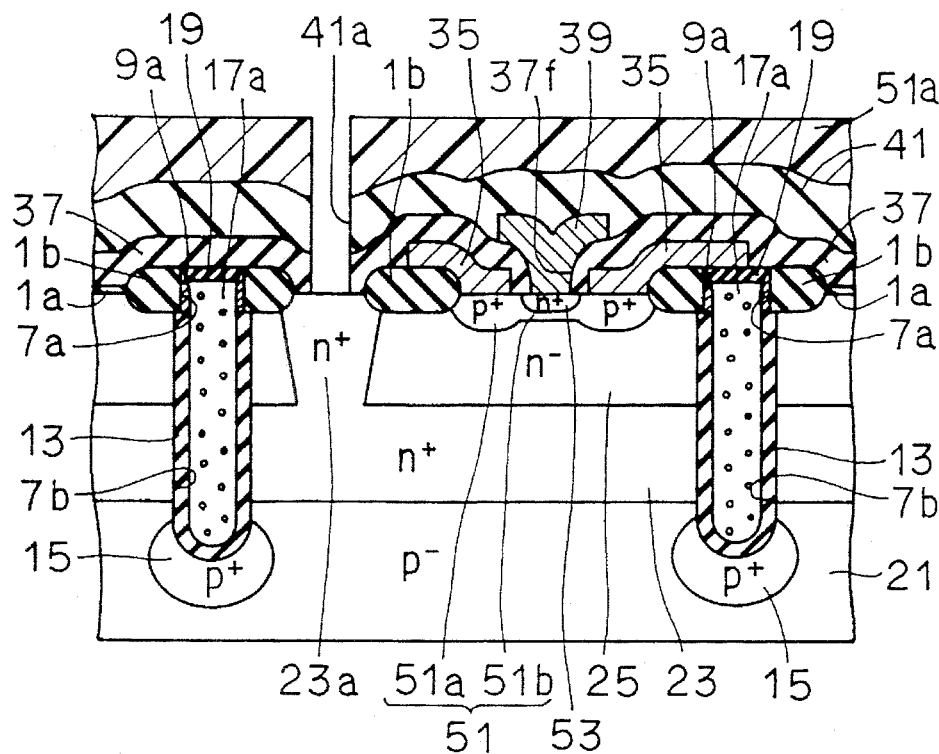

Referring to FIG. 28, a photoresist 51a is applied on the entire surface of insulating layer 41 and patterned into a desired shape. Using thus patterned resist pattern 51a as a mask, insulating layers 41 and 37 are anisotropically etched to form contact hole 41a which penetrates through two insulating layers 41 and 37. Resist pattern 51a is then removed.

Figure 29:
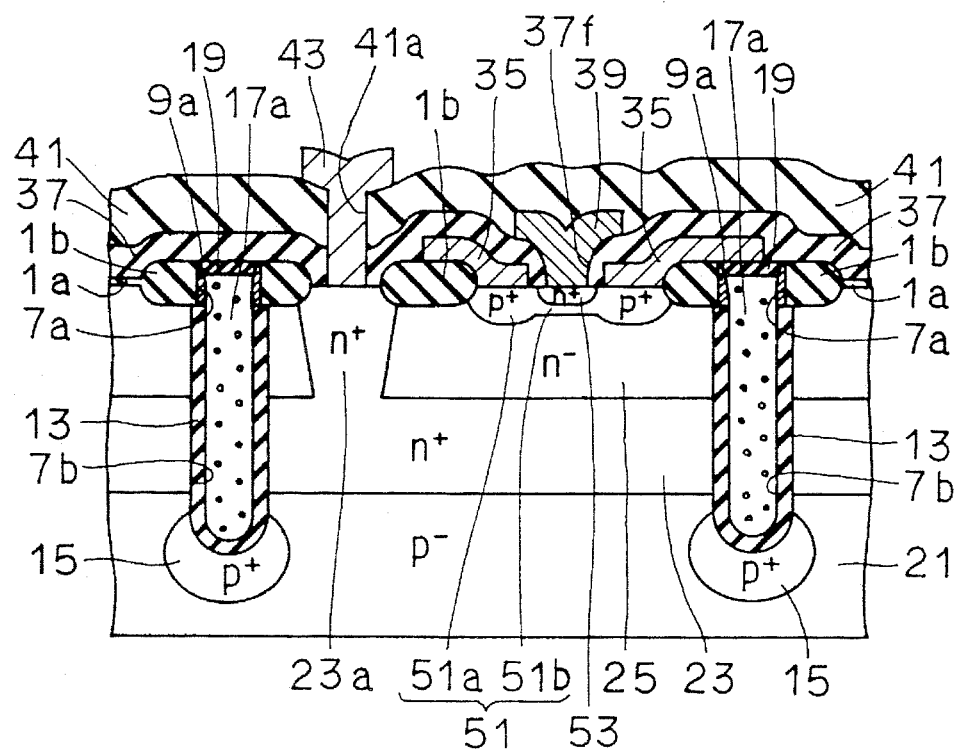

Referring to FIG. 29, conductive layer 43 which is patterned into a desired shape is formed on the surface of insulating layer 41 so as to be in contact with $n^+$ collector wall region 23a via contact hole 41a.

In the method of manufacturing the semiconductor device according to the first embodiment of the present invention, covering layer 9a is formed to cover the sidewall of through hole 7a in the steps shown in FIGS. 5 and 6. After formation of covering layer 9a, the roughness of trench 7b is removed in the steps shown in FIGS. 8 and 9. In other words, silicon oxide film 11 is once formed on the internal wall of trench 7b, and then removed by wet etching.

More specifically, covering 9a is covering the sidewall of element isolation oxide film 1b during wet etching of silicon oxide film 11 to prevent element isolation oxide film 1b from being etched. This prevents the increase of the diameter of through hole 7a due to etching of element isolation oxide film 1b. Therefore, even if polycrystalline silicon layer 17 is formed to fill trench 7b, through hole 7a, and opening 7c in the step shown in FIG. 11, generation of the void in through hole 7a can be avoided. Thus, as shown in FIG. 12, a concave portion due to the void is not generated in the upper surface of filling layer 17a provided by etching back of polycrystalline silicon layer 17.

In the semiconductor device in the first embodiment of the present invention manufactured by the above method, generation of the concave portion due to the void can be prevented in the upper surface of filling layer 17a as shown in FIG. 15. Thus, even when patterning, for example, conductive layer 35 for extracting base electrode shown in FIG. 1 on the substrate including such an element isolation structure, the residue of conductive layer 35 will not be left since the concave portion has not been formed. This prevents respective patterned conductive layers 35 from being electrically short-circuited due to the residue, so that the semiconductor device having a high electrical reliability can be obtained.

EMBODIMENT 2

Figure 30:
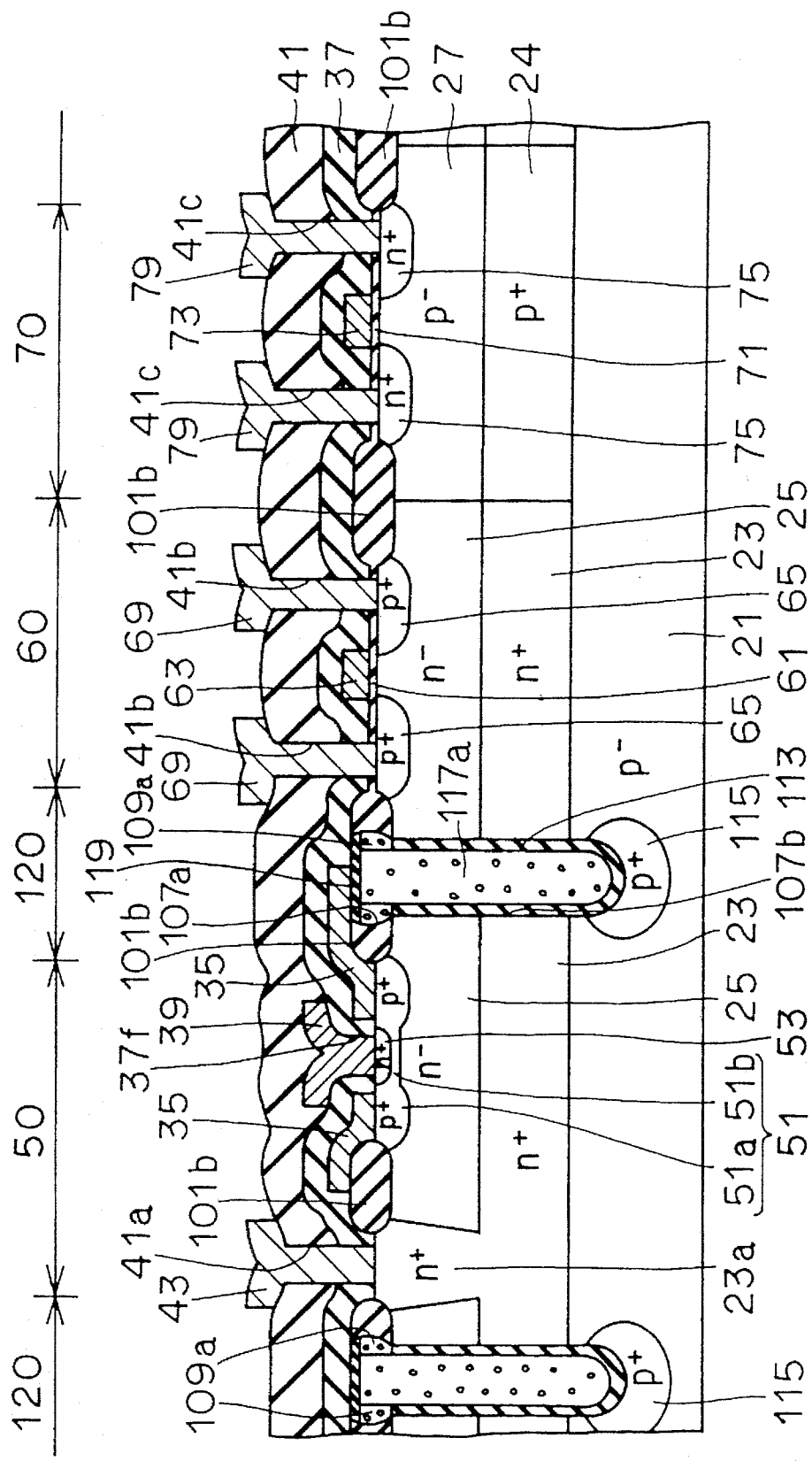
FIG. 30 is a sectional view schematically showing the Bi-CMOS structure of a semiconductor device according to a second embodiment of the present invention.

Referring to FIG. 30, the Bi-CMOS structure includes bipolar transistor region 50, pMOS transistor region 60, nMOS transistor region 70, and an element isolation region 120.

Since bipolar transistor region 50, pMOS transistor region 60, and nMOS transistor 70 are in almost the same structure as in the first embodiment so that the description thereof will not be repeated.

In element isolation region 120, $n^+$ buried layer 23 and $n^-$ epitaxial growth layer 25 are stacked successively on $p^-$ silicon substrate 21. An element isolation oxide film 101b is formed on the surface of $n^-$ epitaxial growth layer 25. A through hole 107a which penetrates through element isolation oxide film 101b to reach the surface of $n^-$ epitaxial growth layer 25 is formed.

A covering layer 109a is formed on element isolation oxide film 101b so as to cover at least an end portion of the sidewall located on trench 107b side within through hole 107a. Covering layer 109a is made of, for example, a polycrystalline silicon layer without any impurities introduced thereinto. A trench 107b is formed in a region under through hole 107a.

Trench 107b penetrates through $n^-$ epitaxial growth layer 25 and $n^+$ buried layer 23 to reach a predetermined depth of $p^-$ silicon substrate 21. A first insulating layer 113 having a predetermined thickness is formed to cover the sidewall of trench 107b.

A filling layer 117a is formed to fill trench 107b so that the top surface of filling layer 117a is located within through hole 107a. Filling layer 117a is made of, for example, polycrystalline silicon. The top surface of filling layer 117a is flush with the top surface of covering layer 109a. A second insulating layer 119 is formed on filling layer 117a and covering layer 109a so as to fill up through hole 107a. Second insulating layer 119 is made of, for example, silicon oxide.

A $p^+$ channel stopper region 115 is formed in a region under trench 107b.

Now, a method of manufacturing a semiconductor device having an element isolation structure in a second embodiment of the present invention will be described below.

Figure 31:
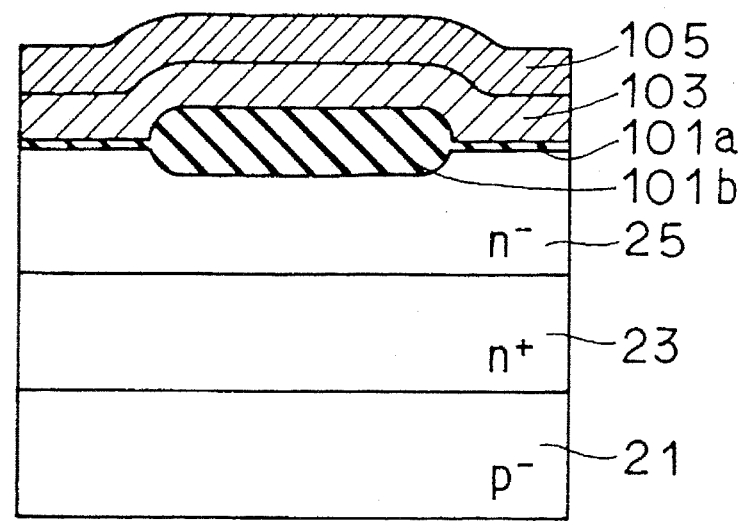
FIGS. 31–41 are sectional views schematically showing a first process of a method of manufacturing the semiconductor device according to the second embodiment of the present invention.

Referring to FIG. 31, $n^+$ buried layer 23 and $n^-$ epitaxial growth layer 25 are stacked successively on the surface of $p^-$ silicon substrate 21. A silicon oxide film 101a and element isolation oxide film 101b having a thickness of about 5000 Å are formed on the surface of $n^-$ epitaxial growth layer 25. A silicon nitride film 103 and a silicon oxide film 105 are respectively formed by the CVD method to have a thickness of 200–500 Å and 6000–8000 Å, respectively, so as to cover the entire surface of $n^-$ epitaxial growth layer 25.

Figure 32:
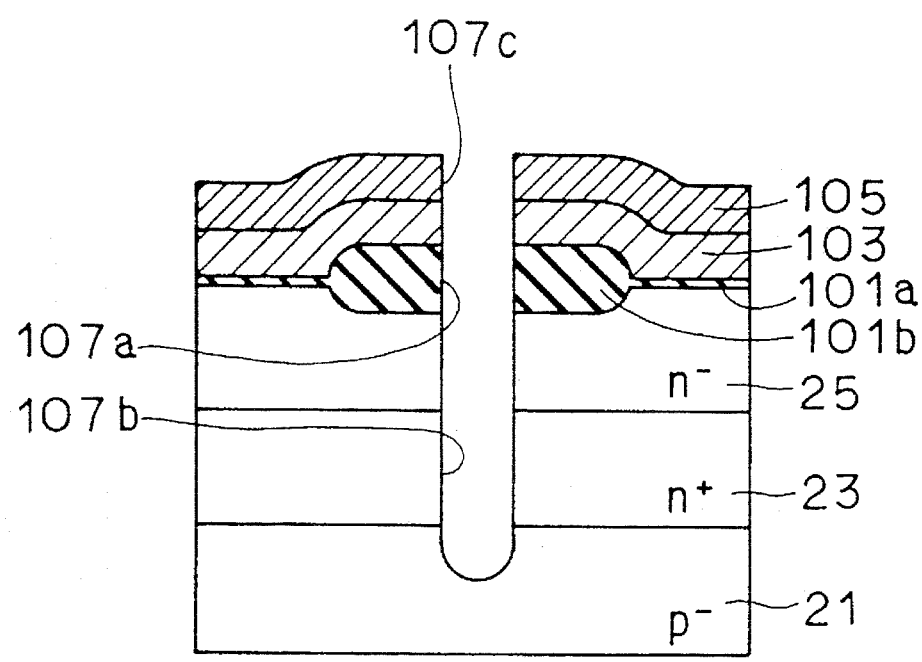

Referring to FIG. 32, an opening 107c which reaches the surface of element isolation oxide film 101b is formed in silicon nitride film 103 and silicon oxide film 105 by photolithography, RIE or the like. The part of element isolation oxide film 101b exposed at the bottom of opening 107c is subjected to anisotropic etching so as to form through hole 107a which penetrates through element isolation oxide film 101b to reach the surface of $n^-$ epitaxial growth layer 25. The part of $n^-$ epitaxial growth layer 25 exposed at the bottom of through hole 107a is subjected to anisotropic etching so as to form trench 107b which penetrates through $n^-$ epitaxial growth layer 25 and $n^+$ buried layer 23 to reach a predetermined depth of $p^-$ silicon substrate 21. Then, wet oxidation is carried out at a temperature of 950° C. in an atmosphere of $O_2+H_2$.

Figure 33:
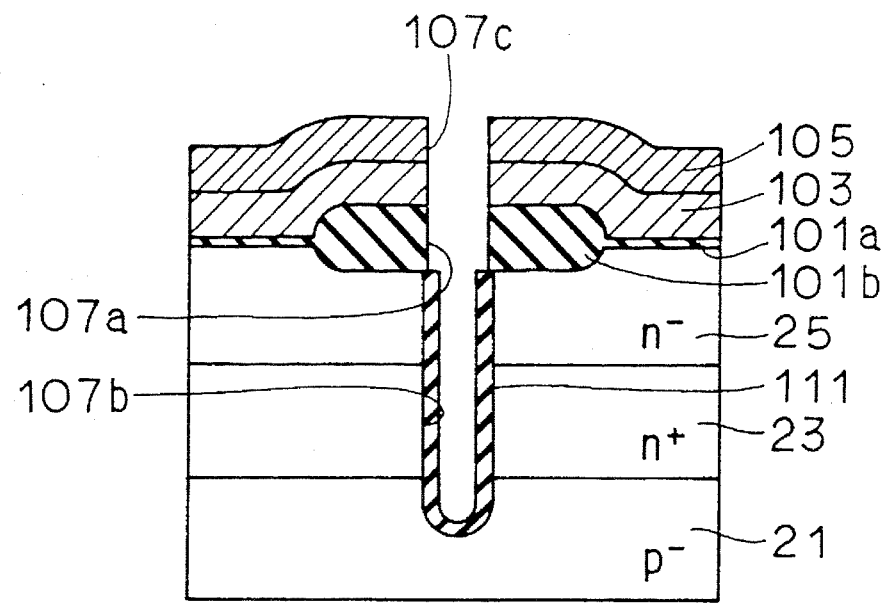

Referring to FIG. 33, the internal wall of trench 107b is oxidized by wet oxidation to form a silicon oxide film 111 having a thickness of about 1000 Å so as to cover the internal wall of 107b. For removal of silicon oxide film 111, wet etching is conducted.

Figure 34:
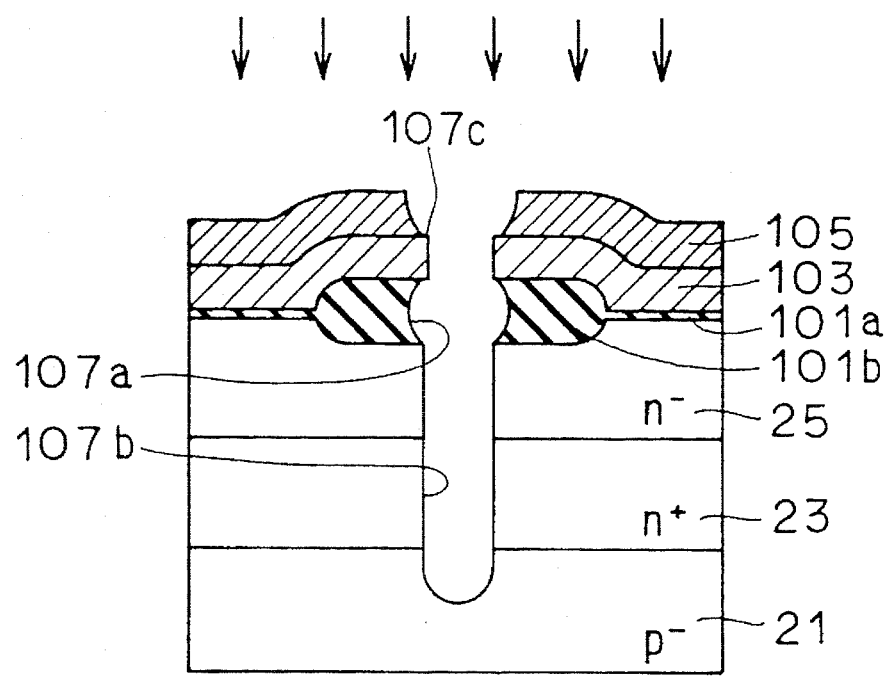

Referring to FIG. 34, silicon oxide film 111 is removed by wet etching. As element isolation oxide film 101b is made of the same material as silicon oxide film 111, a predetermined amount of element isolation oxide film 101b is removed by wet etching to increase the diameter of through hole 107a. Also, the surface of silicon oxide film 105 is isotropically etched. Wet oxidation is then carried out again at the temperature of 950° C. in the atmosphere of $O_2+H_2$.

Figure 35:
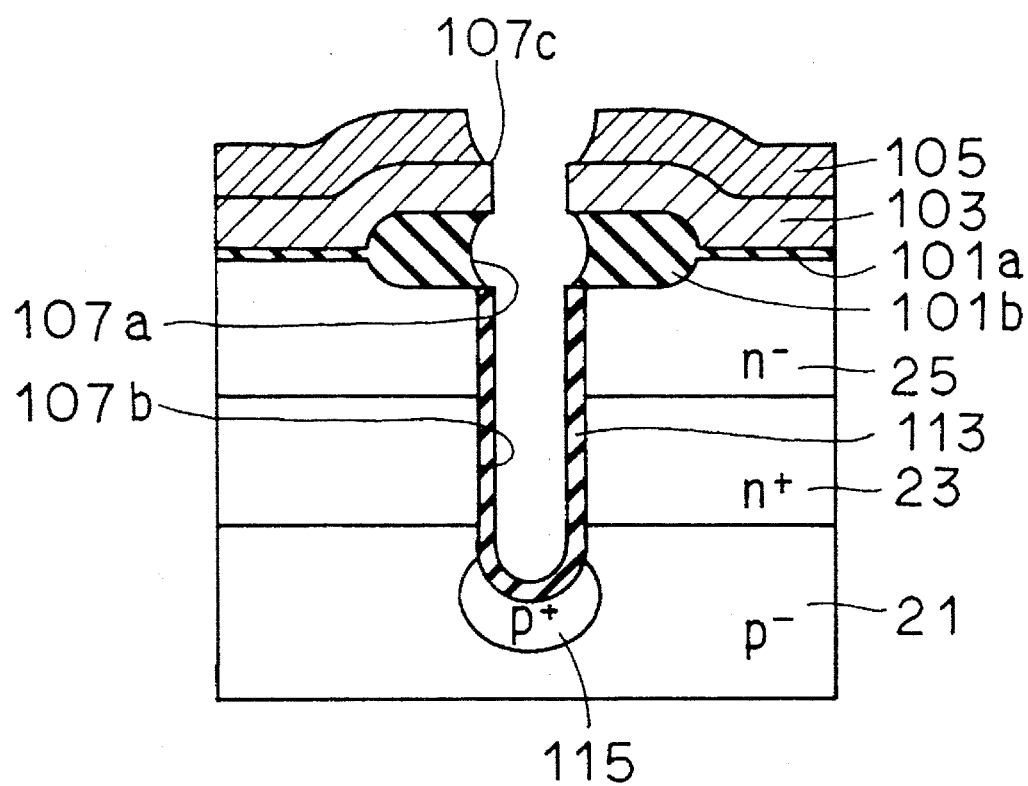

Referring to FIG. 35, the sidewall of trench 107b is oxidized by wet oxidation, so that first insulating layer 113 made of silicon oxide is formed with a thickness of about 1000 Å so as to cover the internal wall of trench 107b. Then, boron ions (B$^+$) are implanted to the bottom of trench 107b. Implanted boron ions are activated and diffused for forming p$^+$ channel stopper 115 under trench 107b.

Figure 36:
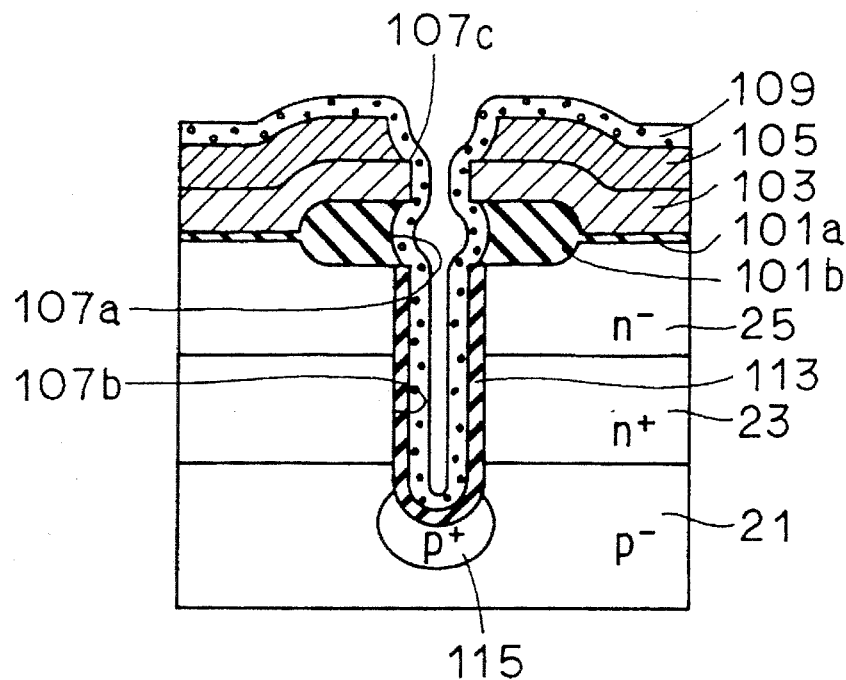

Referring to FIG. 36, a polycrystalline silicon layer 109 is formed by the CVD method to have a thickness of about 1000 Å on the entire surface of silicon oxide film 105 so as to cover the side and bottom walls of trench 107b, through hole 107a, and opening 107c. Polycrystalline silicon layer 109 is then subjected to anisotropic etching.

Figure 37:
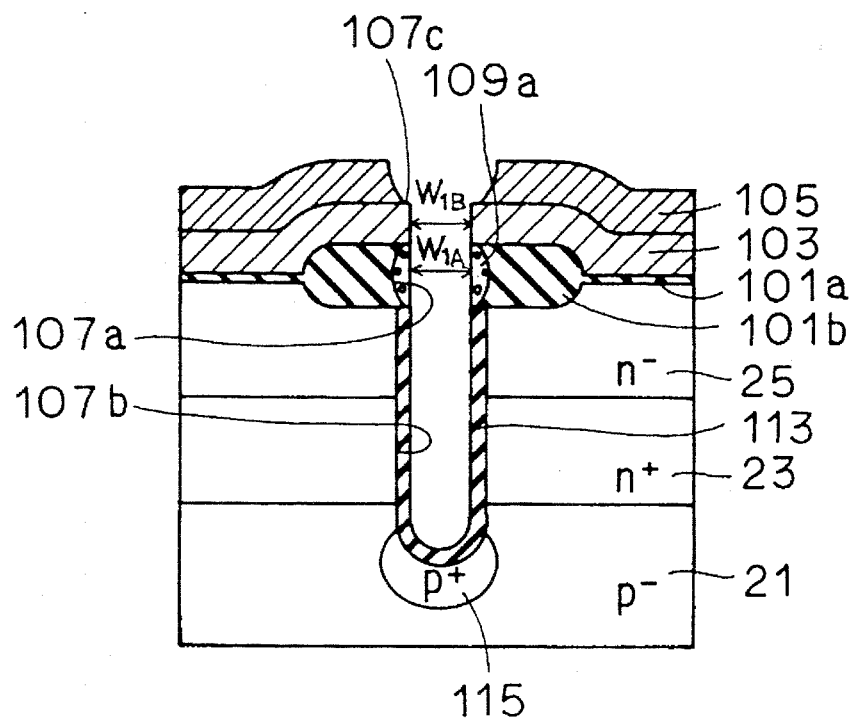

Referring to FIG. 37, covering layer 109a is left to cover the sidewall of element isolation oxide film 101b after anisotropic etching of polycrystalline silicon layer 109. Covering layer 109a is thus formed to make a diameter $W_{1A}$ of through hole 107a substantially equal to a diameter $W_{1B}$ of opening 107c.

Figure 38:
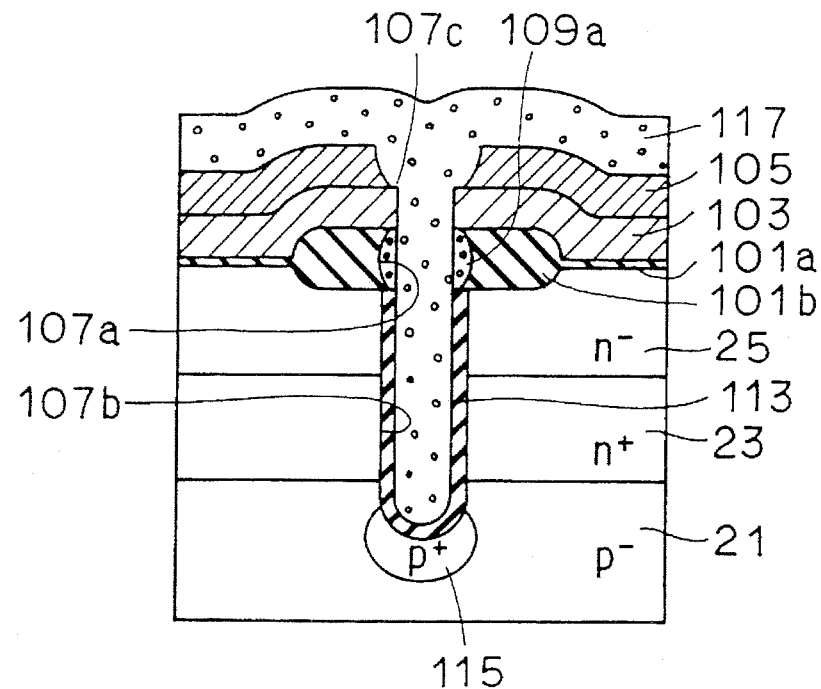

Referring to FIG. 38, a polycrystalline silicon layer 117 having a thickness of about 10000 Å is formed on the entire surface of silicon oxide film 105 by the CVD method, filling trench 107b, through hole 107a, and opening 107c. Etching back of the entire surface of polycrystalline silicon layer 117 is then carried out.

Figure 39:
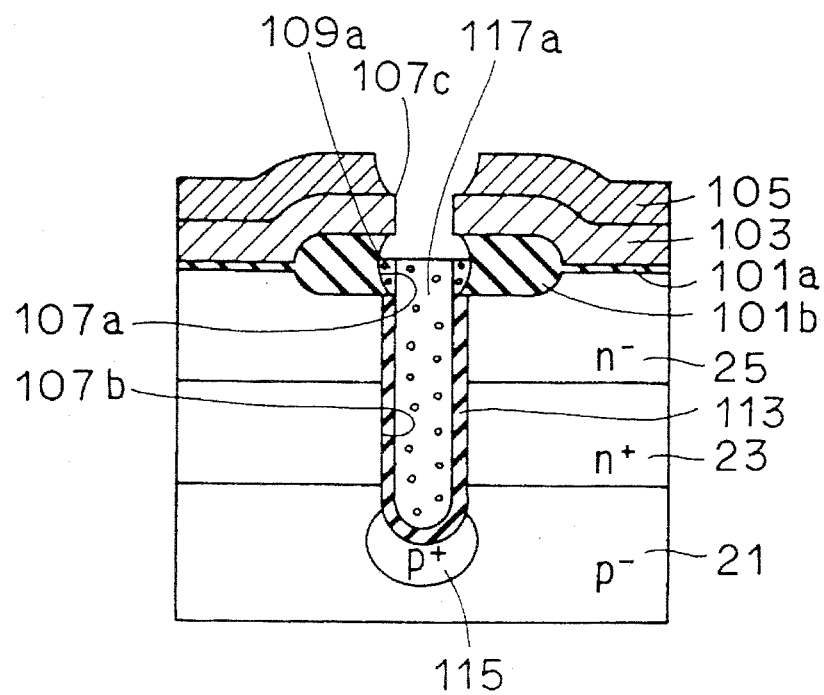

Referring to FIG. 39, filling layer 117a is formed by etching back such that trench 107b is filled and the top surface of filling layer 117a is located within through hole 107a. As covering layer 109a is also made of the same material as filling layer 117a, both layers 109a and 117a are etched at the same speed. The top surface of covering layer 109a is flush with the top surface of filling layer 117a after etching back. During etching back for forming filling layer 117a, silicon oxide film 105 serves as an etching stopper. Silicon oxide film 105 is then removed.

Figure 40:
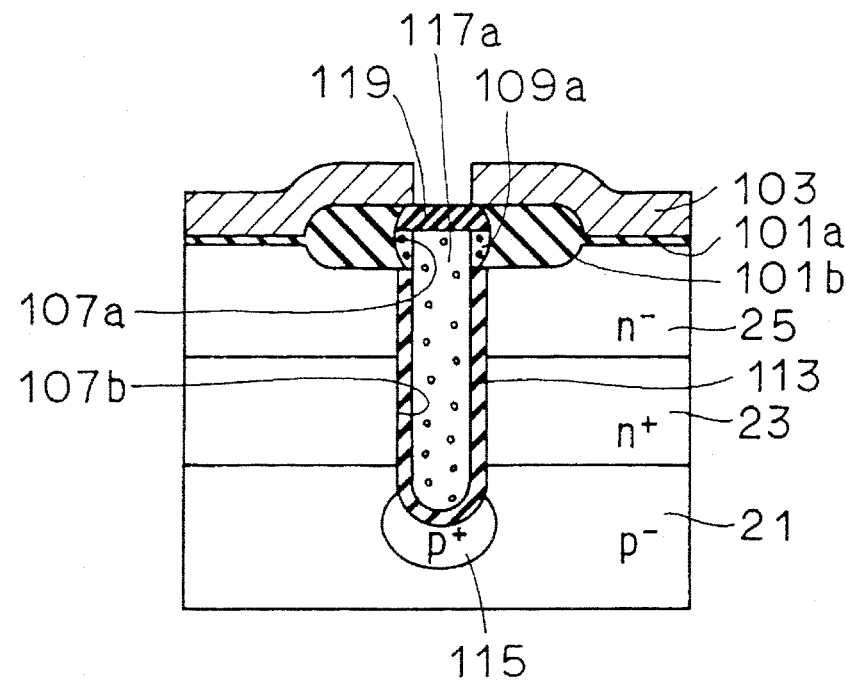
Figure 41:
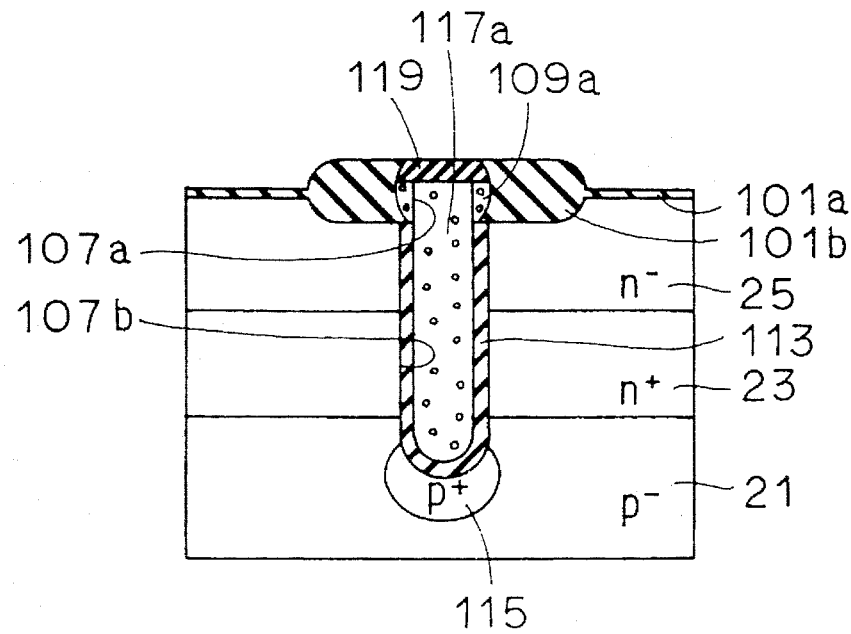

Referring to FIG. 40, thermal oxidation processing is carried out under a predetermined condition with silicon nitride film 103 being maintained. Thus, second insulating layer 119 made of silicon oxide is formed so as to cover the surfaces of filling layer 117a and covering layer 109a to fill up through hole 107a. During thermal oxidation, silicon nitride film 103 prevents entry of oxidation species into the substrate. Silicon nitride film 103 is then removed as shown in FIG. 41.

The method of manufacturing the element isolation structure in the semiconductor device of the second embodiment of the present invention when applied to the bipolar transistor is mostly the same as in the first embodiment so that the description thereof will not be repeated.

In the method of manufacturing the semiconductor device in the second embodiment of the present invention, the roughness of the internal wall of trench 107b is removed in the steps shown in FIGS. 33 and 34. More specifically, silicon oxide film 111 is once formed to cover the internal wall of trench 107b, and then removed by wet etching in which etching proceeds isotropically.

As element isolation oxide film 101b is made of the same material as silicon oxide film 111, a predetermined amount of element isolation oxide film 101b is removed by wet etching, resulting in the increased diameter of through hole 107a larger than the diameter of silicon nitride film 103.

In the steps shown in FIGS. 36, 37, however, covering layer 109a is formed to cover the entire sidewall of element isolation oxide film 101b within through hole 107a. Covering layer 109a thus formed to make diameter $W_{1A}$ of through hole 107a substantially equal to diameter $W_{1B}$ of silicon nitride film 103.

Therefore, generation of the void in polycrystalline silicon layer 117 formed in the step shown in FIG. 38 in through hole 107a can be prevented. Accordingly, the concave portion due to the void is not formed in the upper surface of filling layer 117a provided by etching back of polycrystalline silicon layer 117.

As described above, in the semiconductor device of the present embodiment manufactured by the above method, the concave portion due to the void is not formed in the upper surface of filling layer 117a as shown in FIG. 41. Thus, when patterning the conductive layer on the substrate wherein such an element isolation structure is formed, generation of the residue can be avoided because the concave portion does not exist. This prevents short circuit of individual conductive layers caused by the residue. As a result, such an semiconductor device which has an enhanced electrical reliability can be obtained.

EMBODIMENT 3

Figure 42:
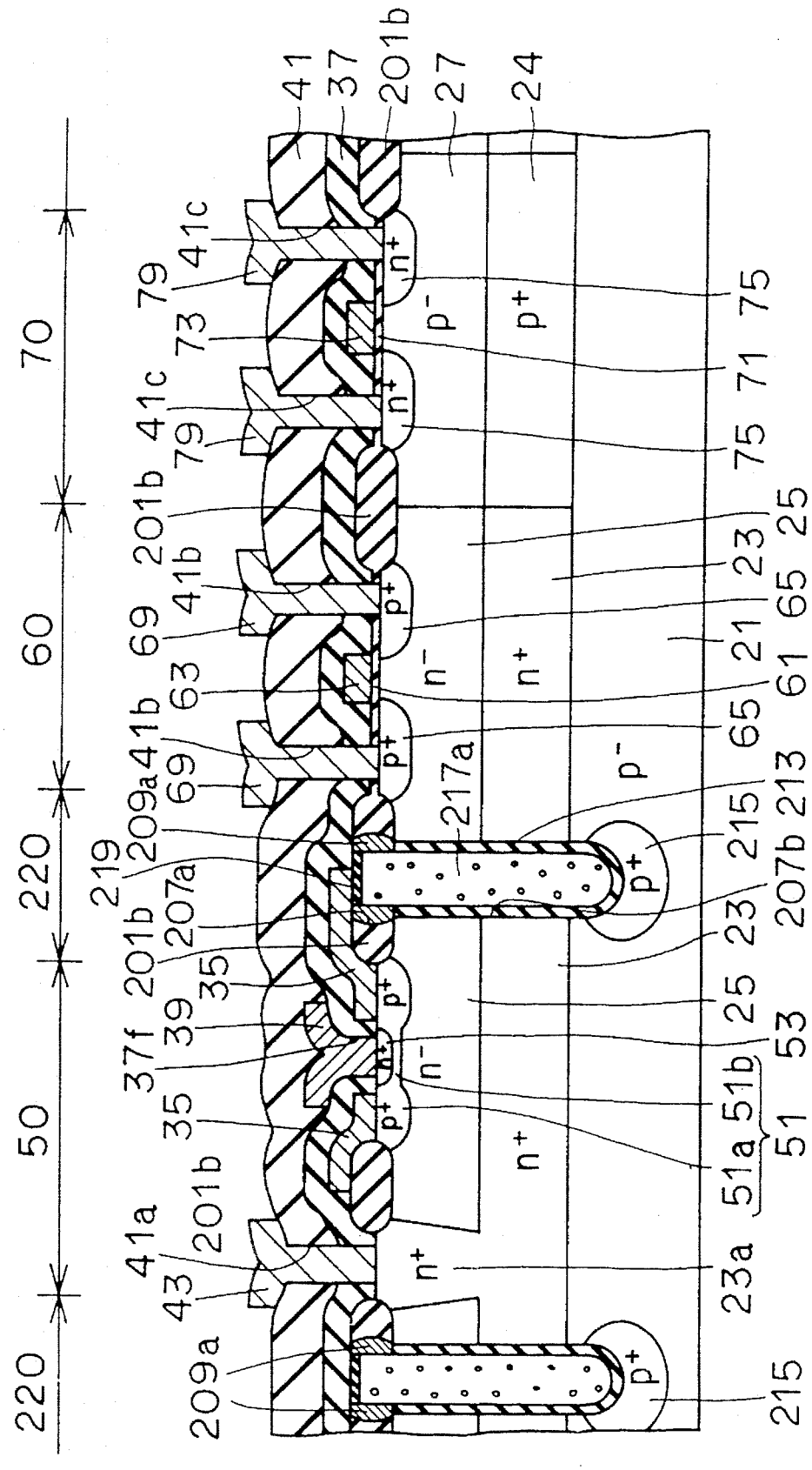
FIG. 42 is a sectional view schematically showing the Bi-CMOS structure of a semiconductor device according to a third embodiment of the present invention.

Referring to FIG. 42, the Bi-CMOS structure includes bipolar transistor region 50, pMOS transistor region 60, nMOS transistor region 70, and an element isolation region 220.

Since bipolar transistor region 50, pMOS transistor region 60, and nMOS transistor region 70 are in almost the same structure as in the first embodiment, the description thereof will not be repeated.

In element isolation region 220, n$^+$ buried layer 23, and n$^-$ epitaxial growth layer 25 are stacked successively on the surface of p$^-$ silicon substrate 21. An element isolation oxide film 201b is formed on the surface of n$^-$ epitaxial growth layer 25. A through hole 207a which penetrates through element isolation oxide film 201b to reach the surface of n$^-$ epitaxial growth layer 25 is formed.

A covering layer 209a is formed to cover the entire sidewall of element isolation oxide film 201b within through hole 207a. Covering layer 209a is made of, for example, a silicon nitride film. A trench 207b is formed under through hole 207a.

Trench 207b is formed to penetrate through n$^-$ epitaxial growth layer 25 and n$^+$ buried layer 23 to reach a predetermined depth of p$^-$ silicon substrate 21. A first insulating layer 213 is formed to cover the internal wall of trench 207b. First insulating layer 213 is made of, for example, silicon oxide.

A filling layer 217a is formed such that trench 207b is filled and the top surface of filling layer 217a is located within the region of through hole 207a. Filling layer 217a is made of, for example, polycrystalline silicon. A second insulating layer 219 is formed on filling layer 217a to fill up through hole 207a. Second insulating layer 219 is made of, for example, silicon oxide.

It is noted that a p$^+$ channel stopper region 215 is formed under trench 207b in order to further improve the element isolation effect.

Now, a method of manufacturing a semiconductor device having an element isolation structure according to a third embodiment of the present invention will be described below.

Figure 43:
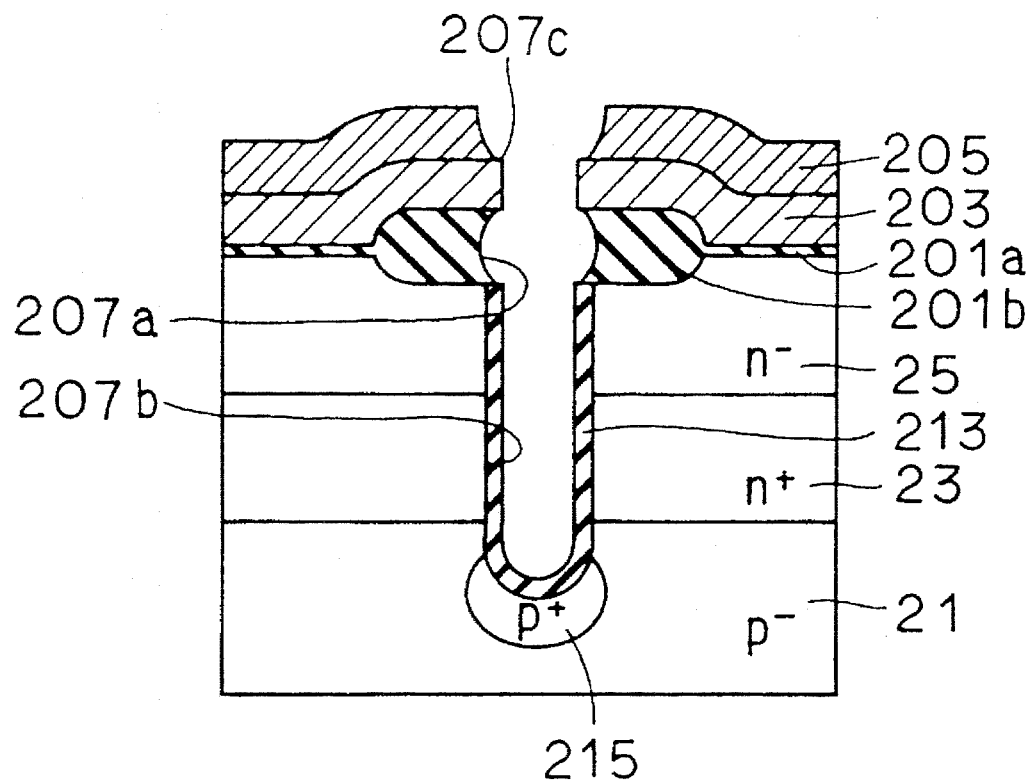
FIGS. 43–50 are sectional views schematically showing a first process of a method of manufacturing the semiconductor device according to the third embodiment of thee present invention.

The process is the same as in the second embodiment until the step shown in FIG. 43 so that the description thereof will not be repeated.

Figure 44:
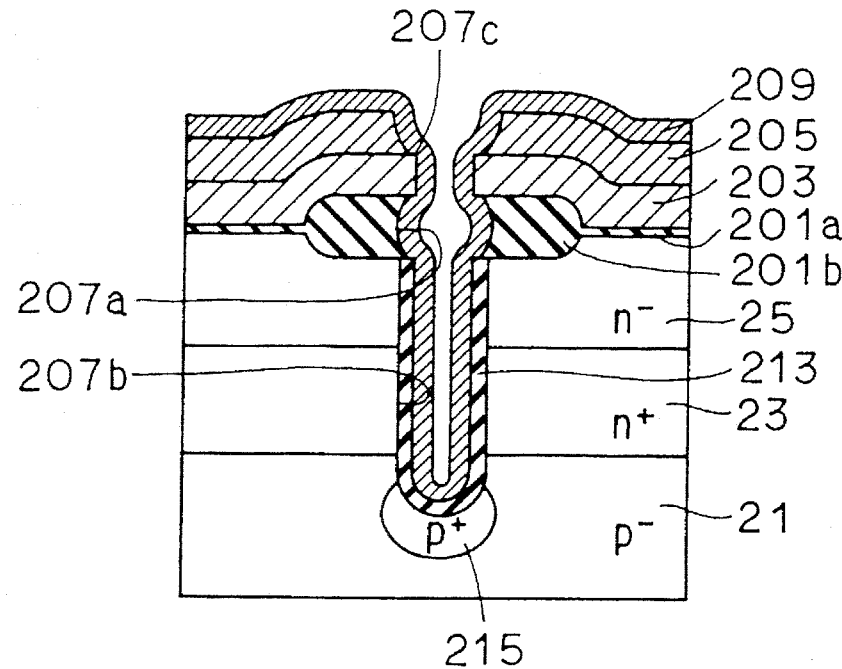

Referring to FIG. 44, a silicon nitride film 209 is formed on a silicon oxide film 205 to have a thickness of about 1000 Å by the CVD method to cover the side and bottom walls of trench 207b, through hole 207a, and opening 207c. Silicon nitride film 209 is then subjected to anisotropic etching.

Figure 45:
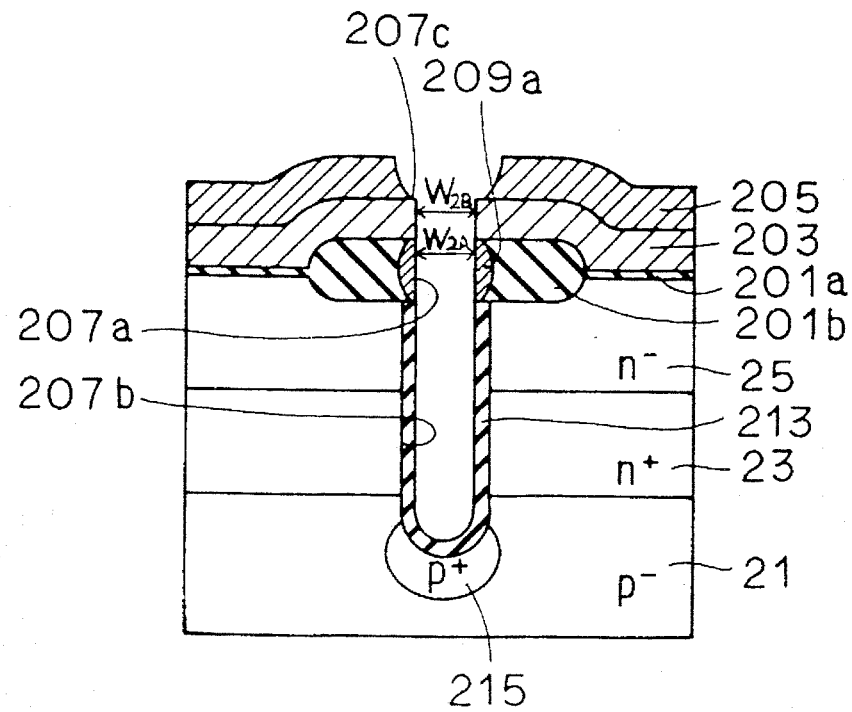

Referring to FIG. 45, a covering layer 209a made of silicon nitride is formed by the above anisotropic etching so as to cover the entire sidewall of element isolation oxide film 201b within through hole 207a. Thus, a diameter $W_{2A}$ of through hole 207a covered by covering layer 209a becomes substantially equal to a diameter $W_{2B}$ of the opening of a silicon nitride film 203.

Figure 46:
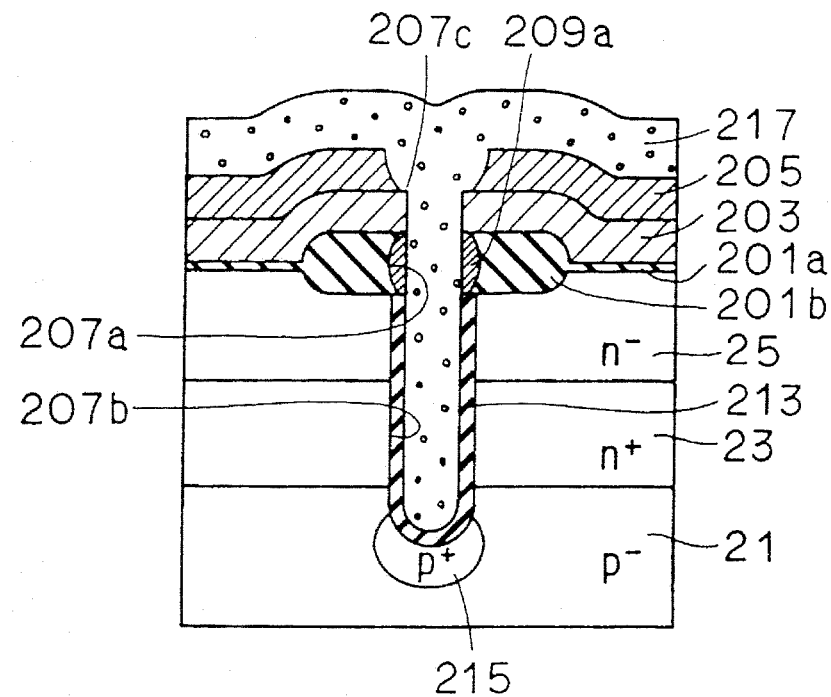

Referring to FIG. 46, a polycrystalline silicon layer 217 is formed on the entire surface of silicon nitride film 205 to have a thickness of about 10000 Å by the CVD method filling trench 207b, through hole 207a, and opening 207c. Since the diameters of the opening of a silicon nitride film 203 and through hole 207a becomes substantially equal, generation of the void in polycrystalline silicon layer 217 within the region of through hole 207a can be prevented. The entire surface of polycrystalline silicon layer 217 is then etched back.

Figure 47:
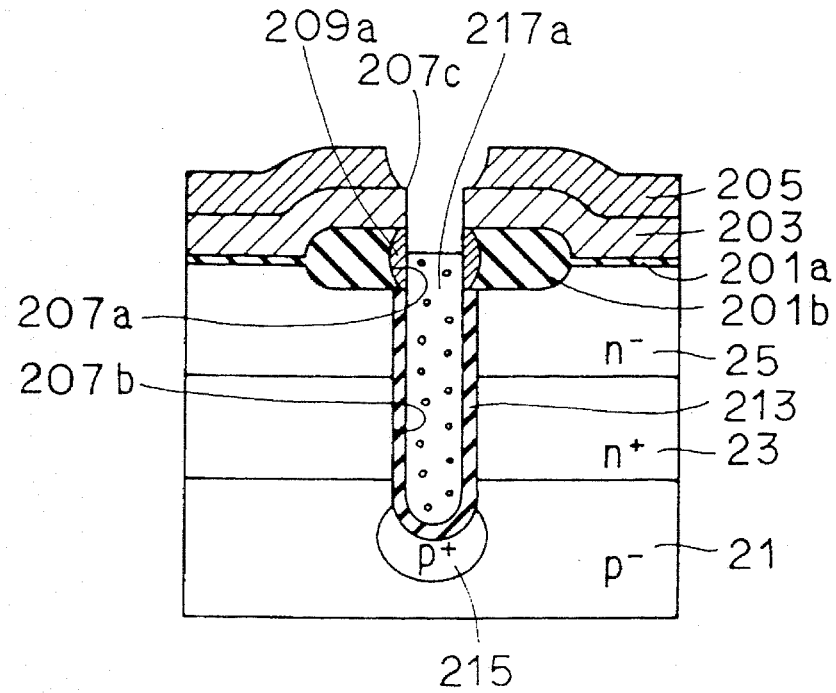

Referring to FIG. 47, a filling layer 217a made of polycrystalline silicon is formed by the above etching back of the entire surface such that trench 207b is filled and the top surface of filling layer 217a is located within through hole 207a. Silicon oxide film 205 serves as an etching stopper during etching back, and then is removed.

Figure 48:
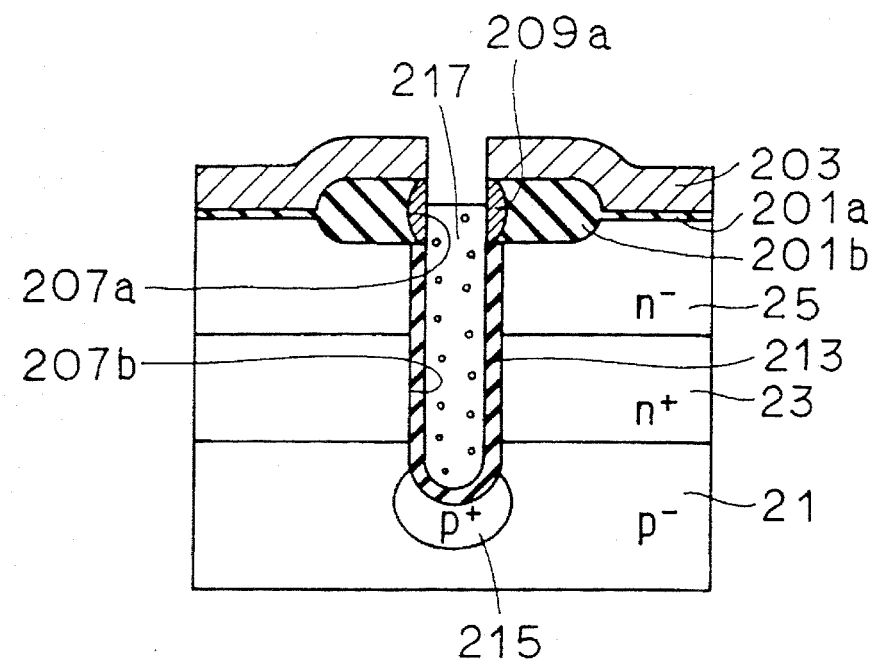

Referring to FIG. 48, removal of silicon oxide film 205 causes the surface of silicon nitride film 203 to be exposed. The thermal oxidation processing is carried out under a predetermined condition with silicon nitride film 203 maintained. During thermal oxidation, silicon nitride film 203 prevents entry of oxidation species into the substrate located in the lower layers. In other words, the excess oxidation of the substrate in the lower layers can be prevented by silicon nitride film 203.

Figure 49:
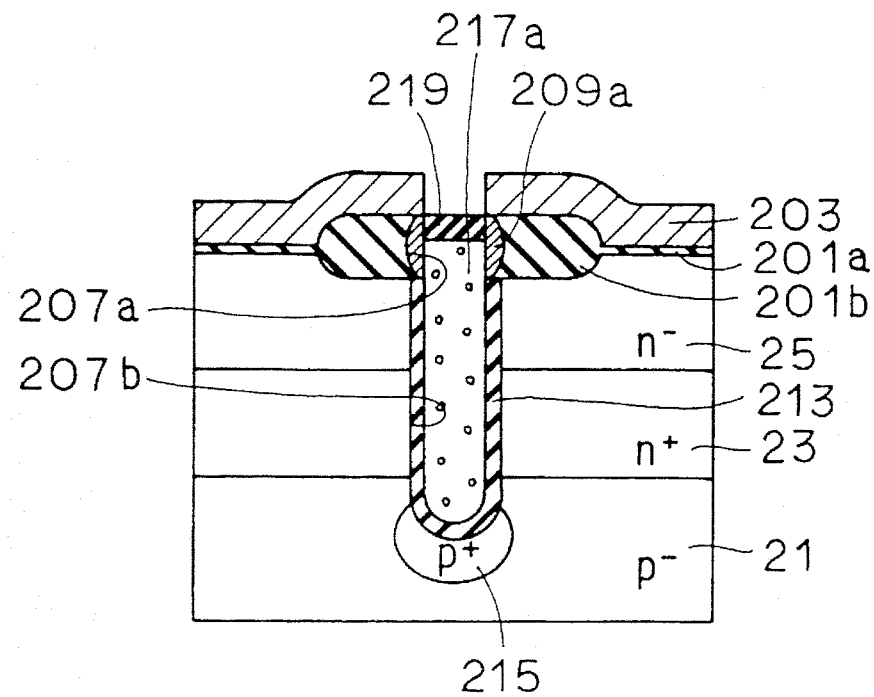
Figure 50:
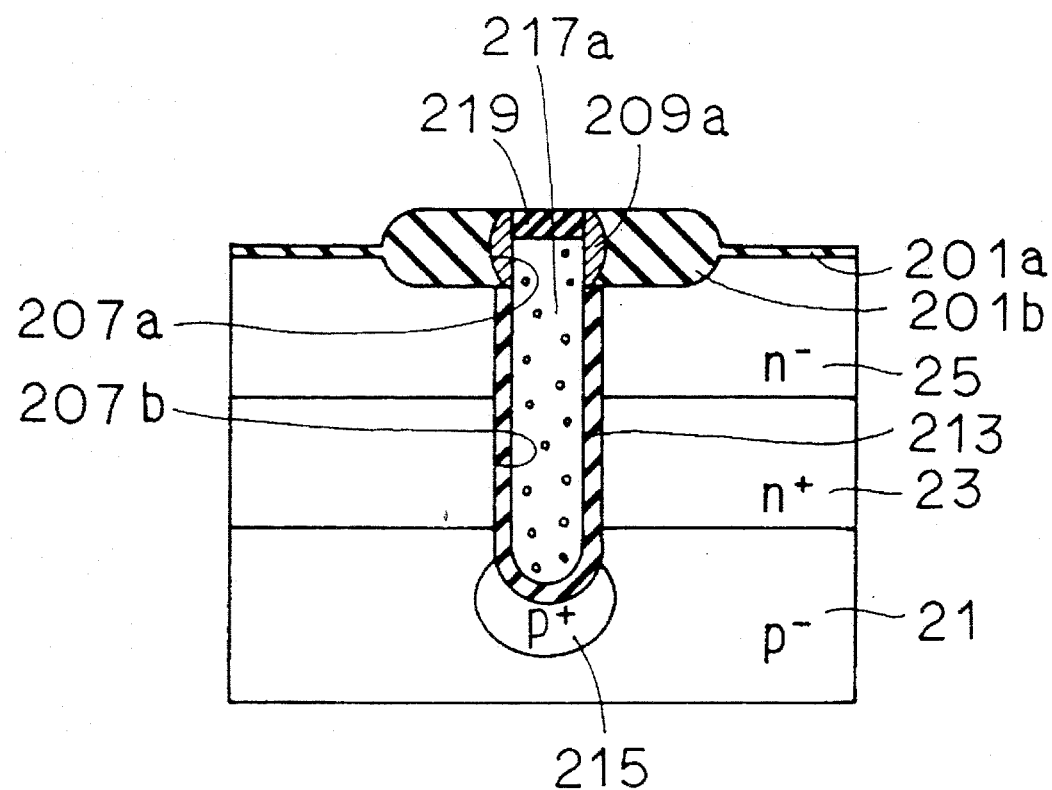
Figure 51:
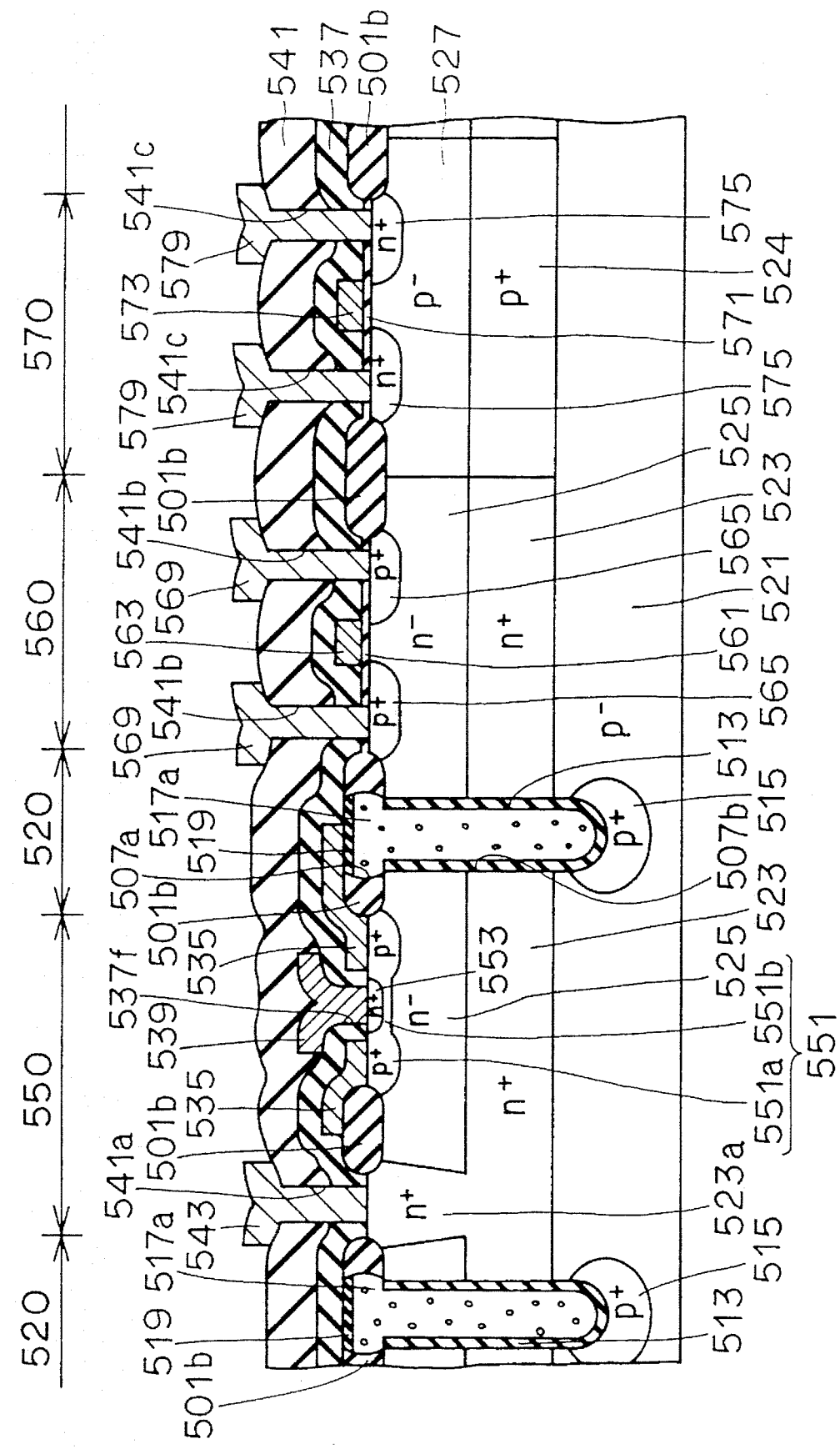
FIG. 51 is a sectional view schematically showing the Bi-CMOS structure of a conventional semiconductor device.
Figure 52:
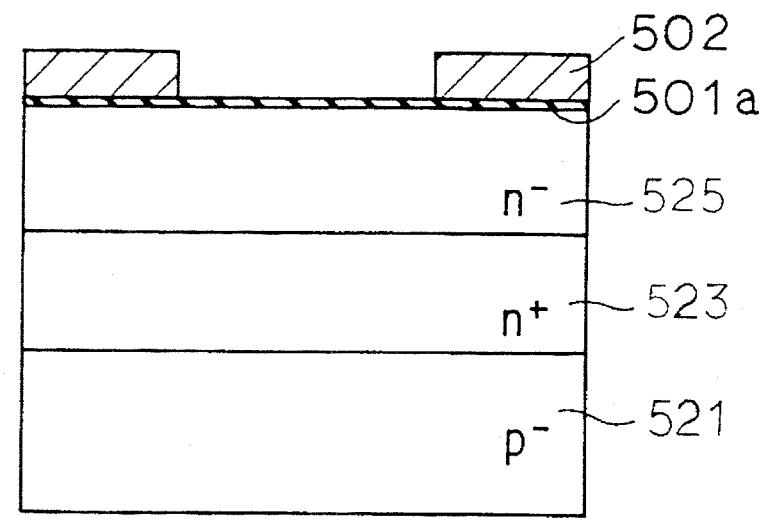
FIGS. 52–64 are sectional views schematically showing a first process of a method of manufacturing the conventional semiconductor device.
Figure 53:
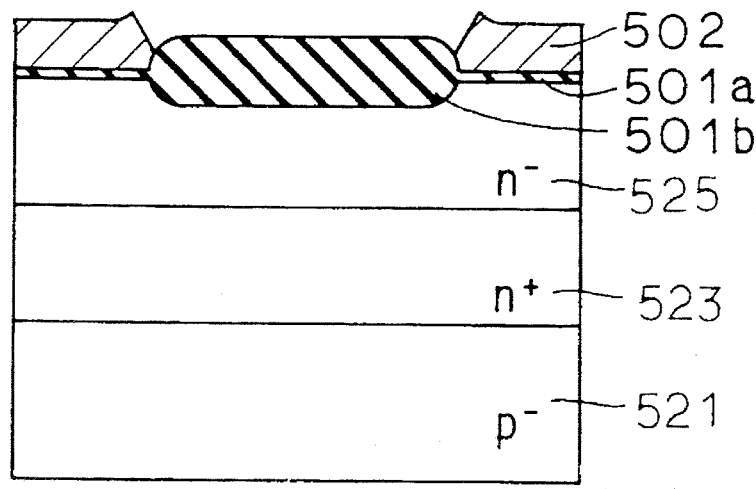
Figure 54:
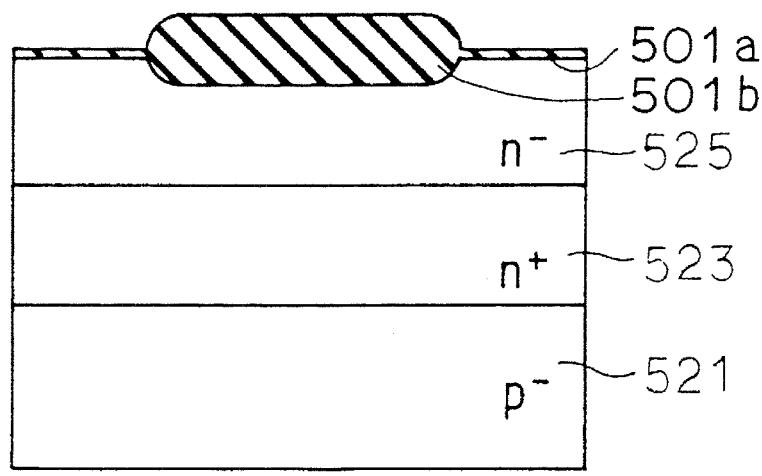
Figure 55:
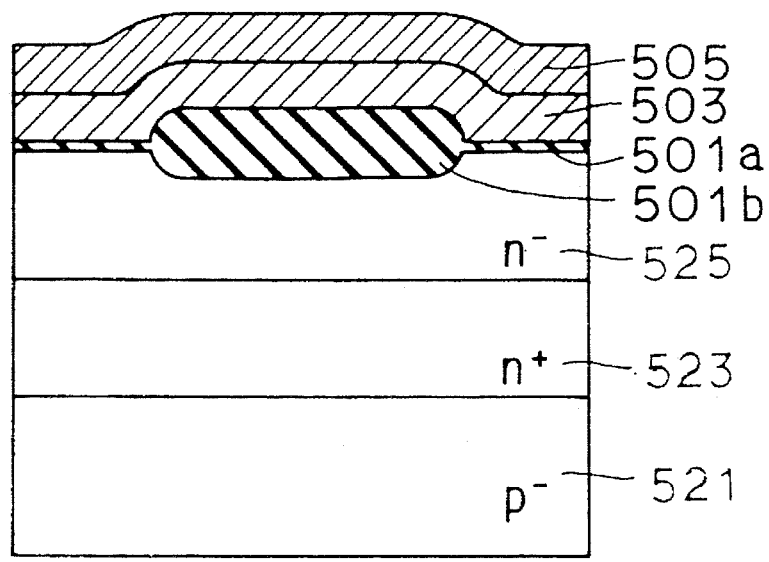
Figure 56:
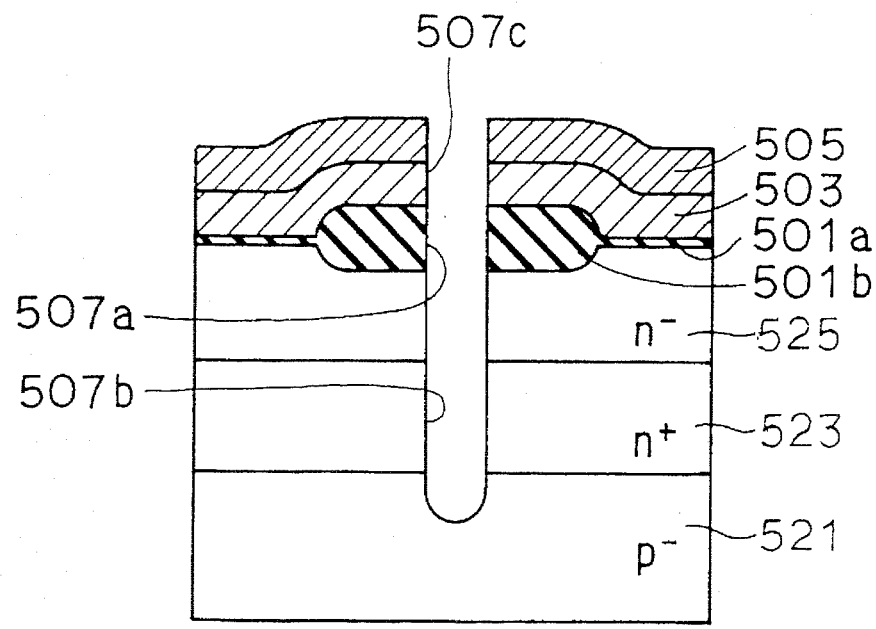
Figure 57:
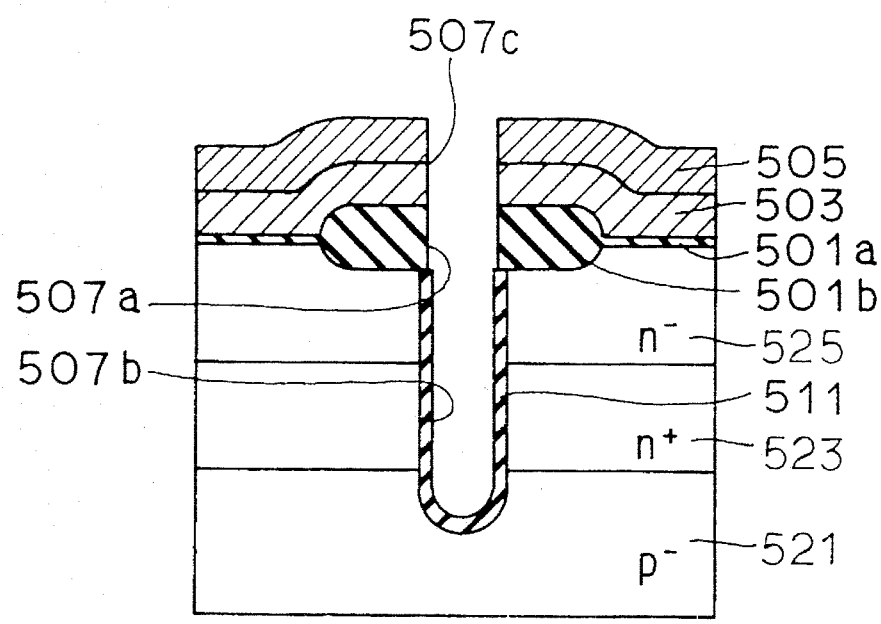
Figure 58:
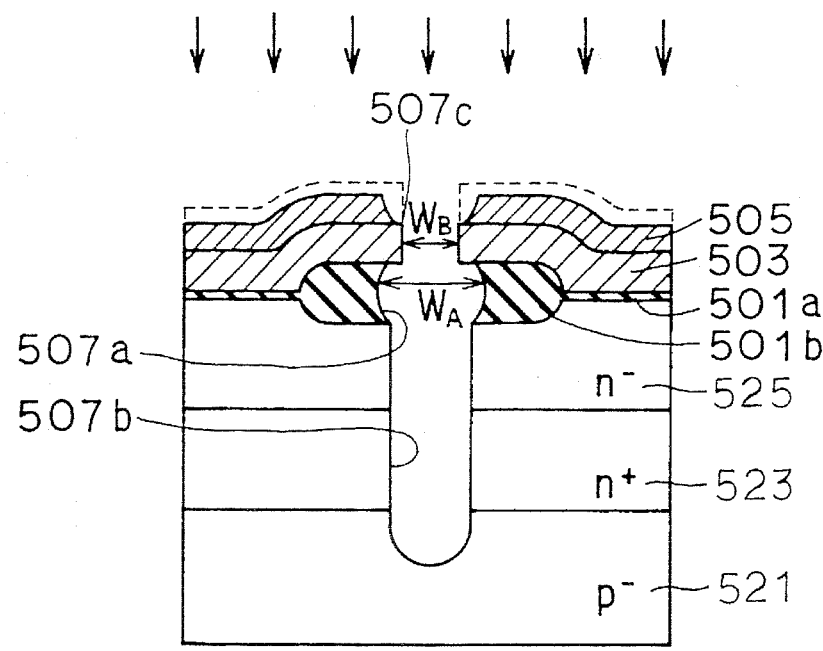
Figure 59:
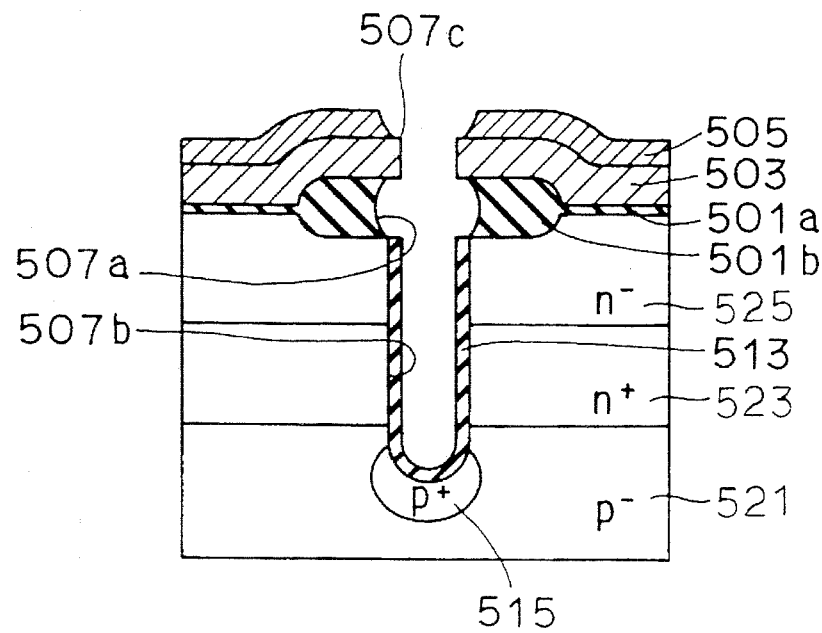
Figure 60:
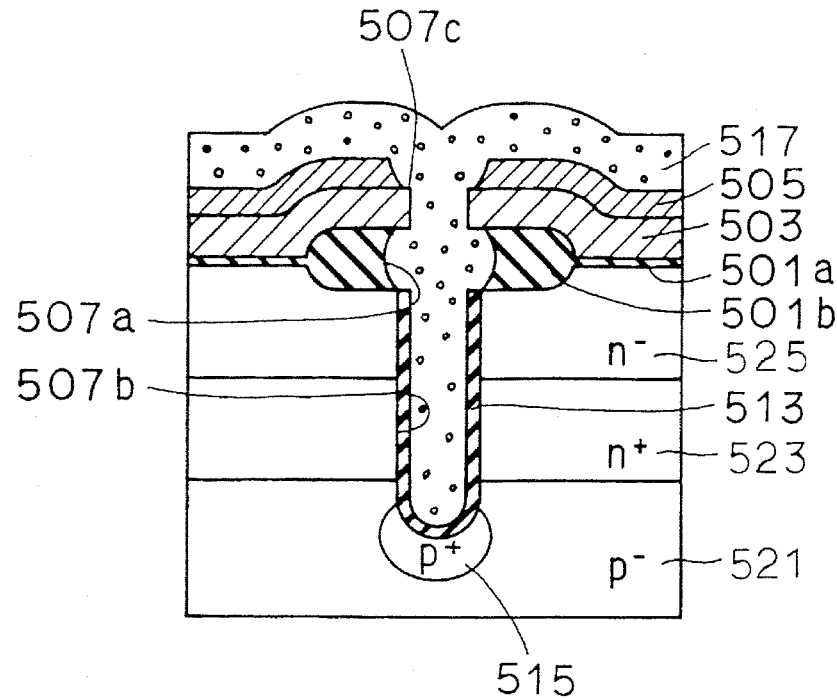
Figure 61:
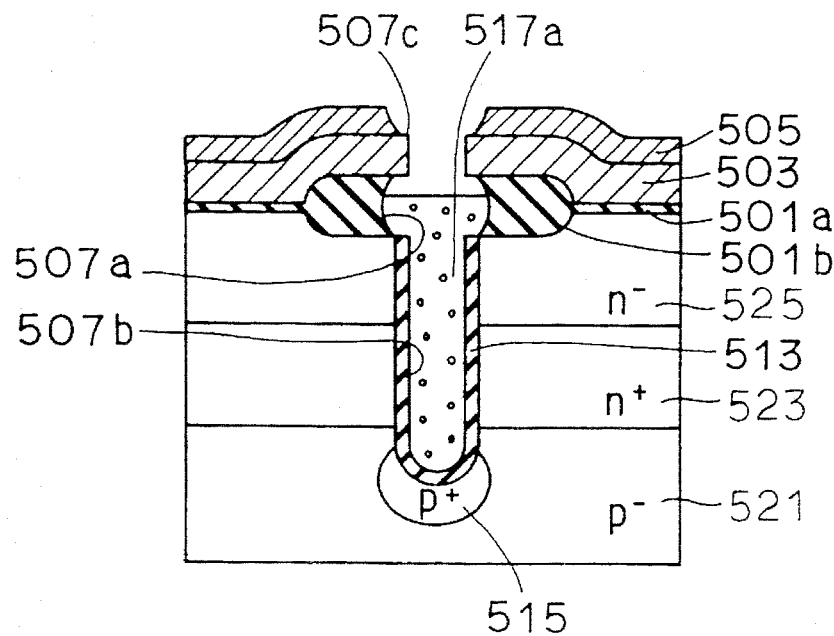
Figure 62:
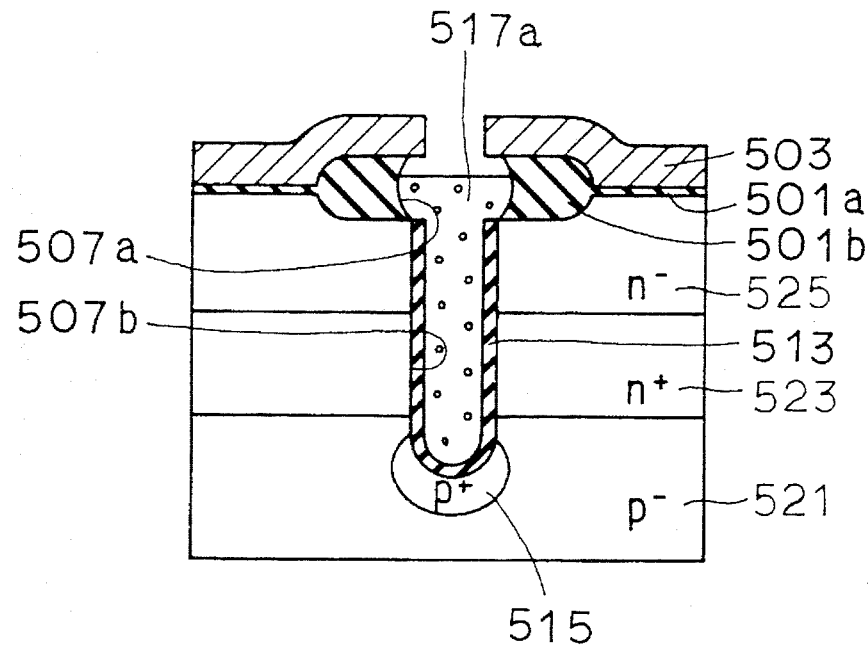
Figure 63:
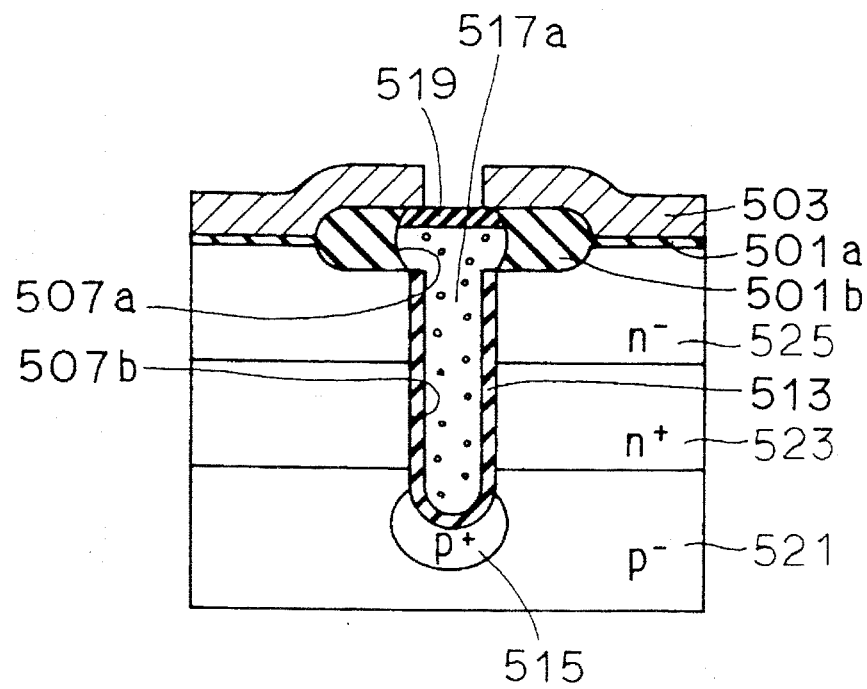
Figure 64:
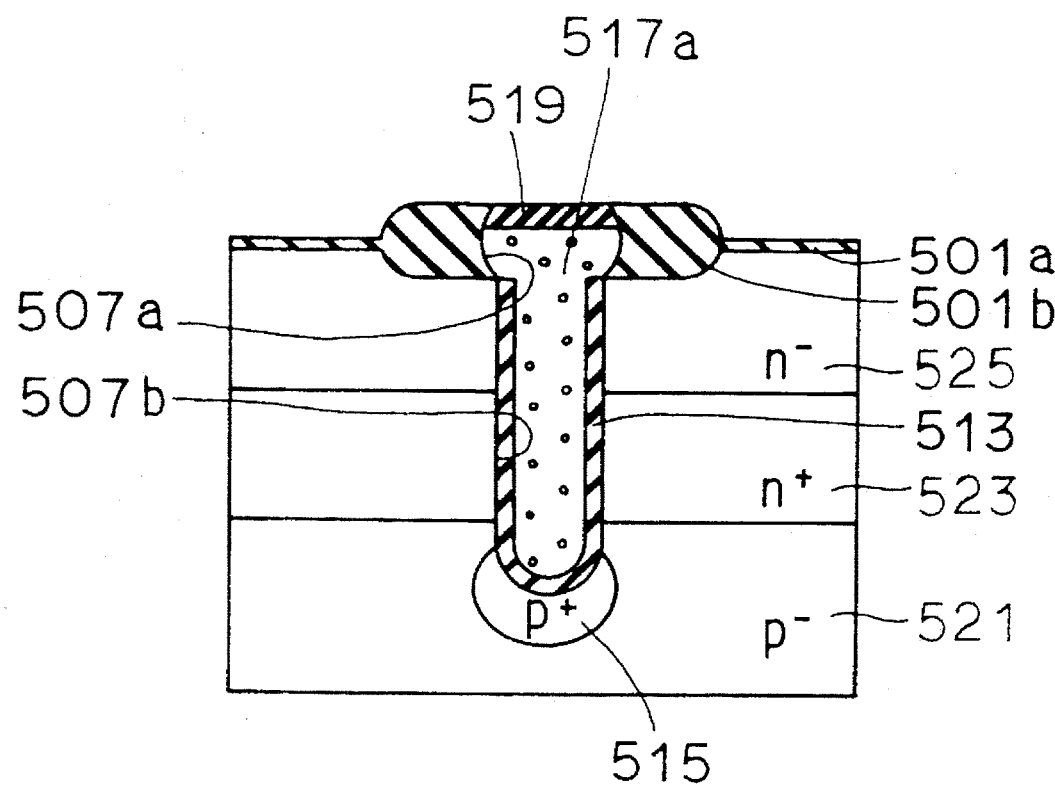
Figure 65:
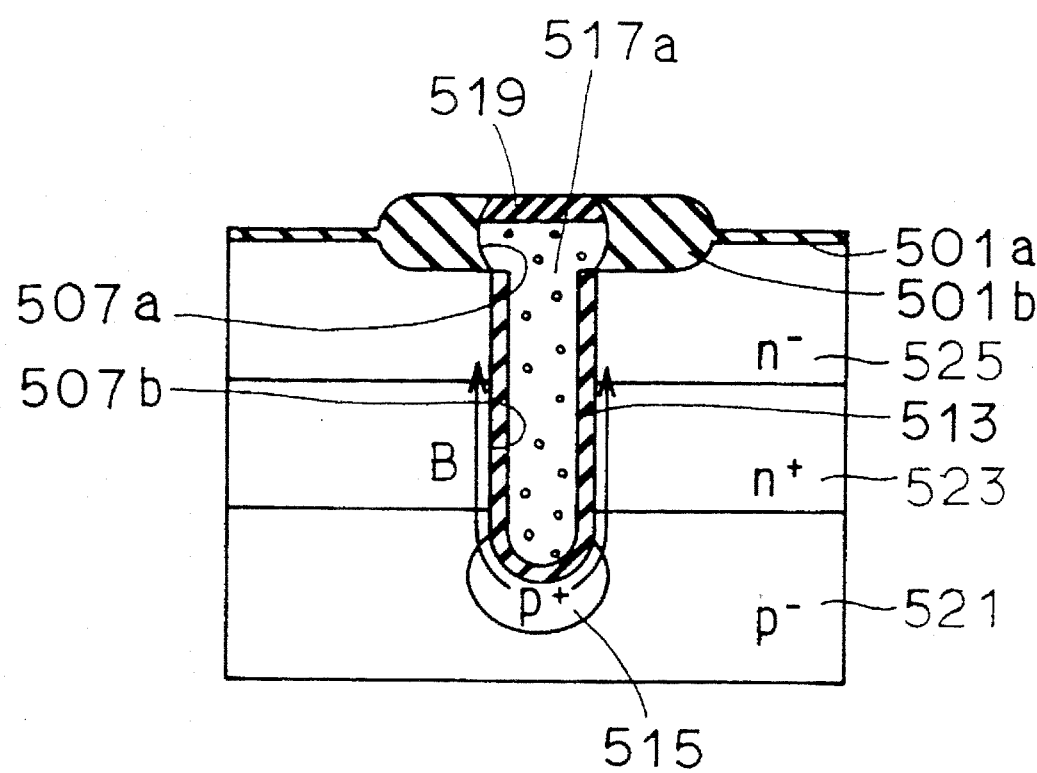
FIG. 65 is a view illustrating a problem incurred when the element isolation structure is formed with roughness generated on the internal wall of the trench.
Figure 66:
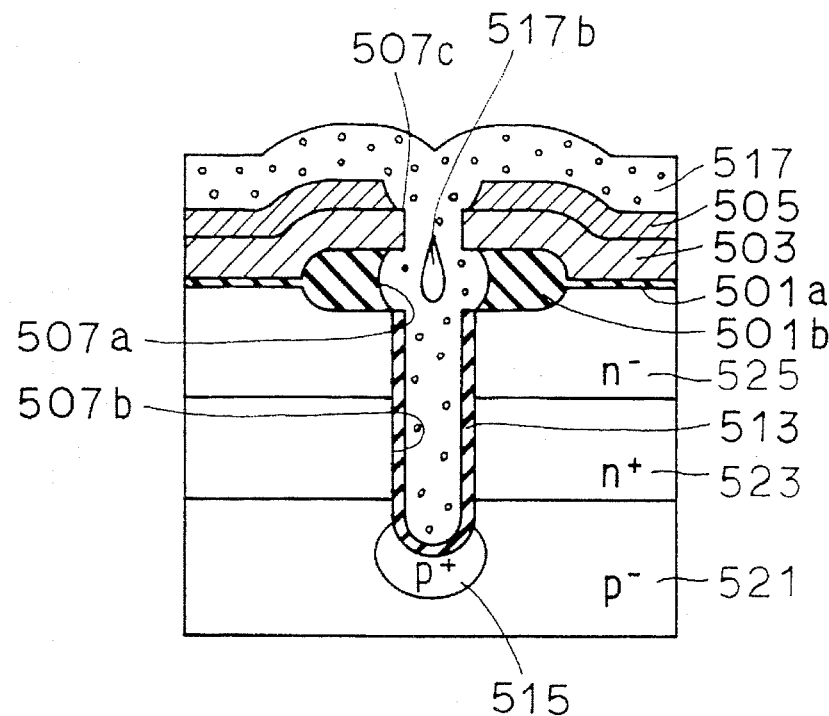
FIGS. 66–68 are views illustrating problems caused by the conventional semiconductor device.
Figure 67:
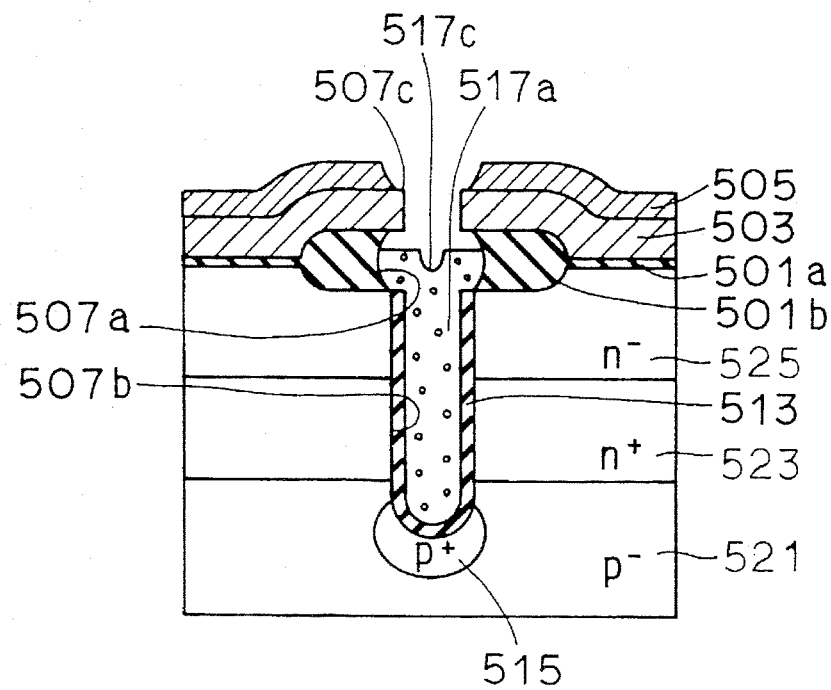
Figure 68:
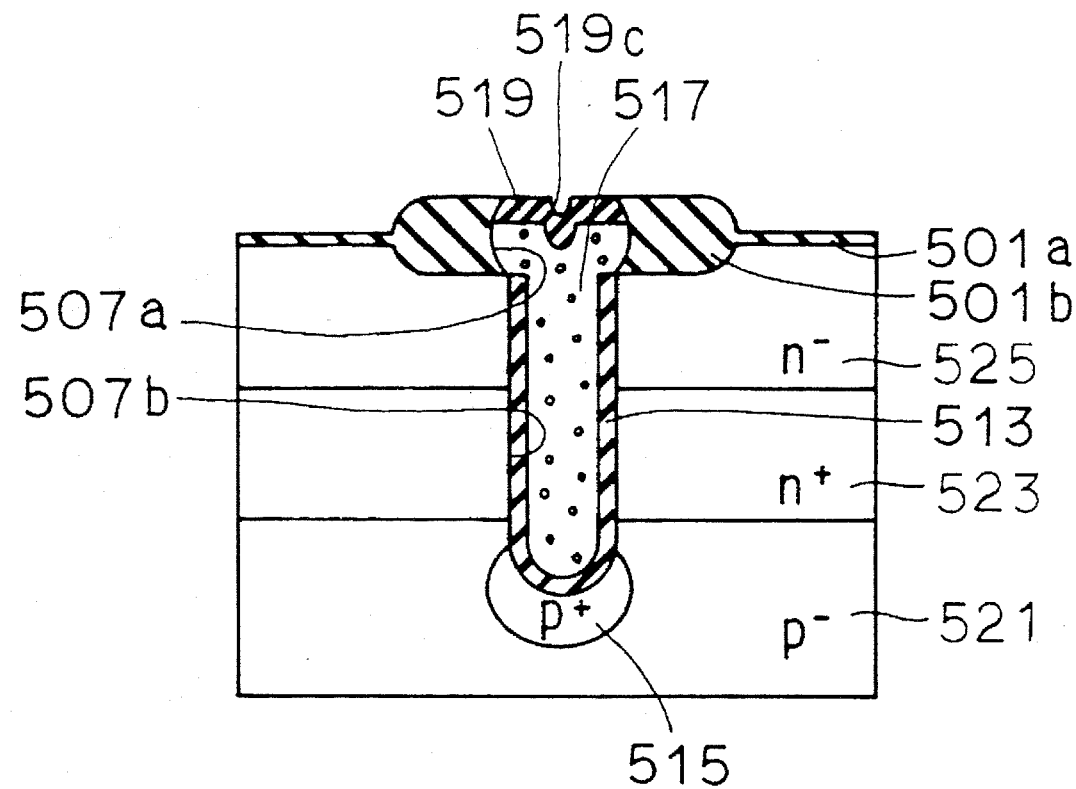
Figure 69:
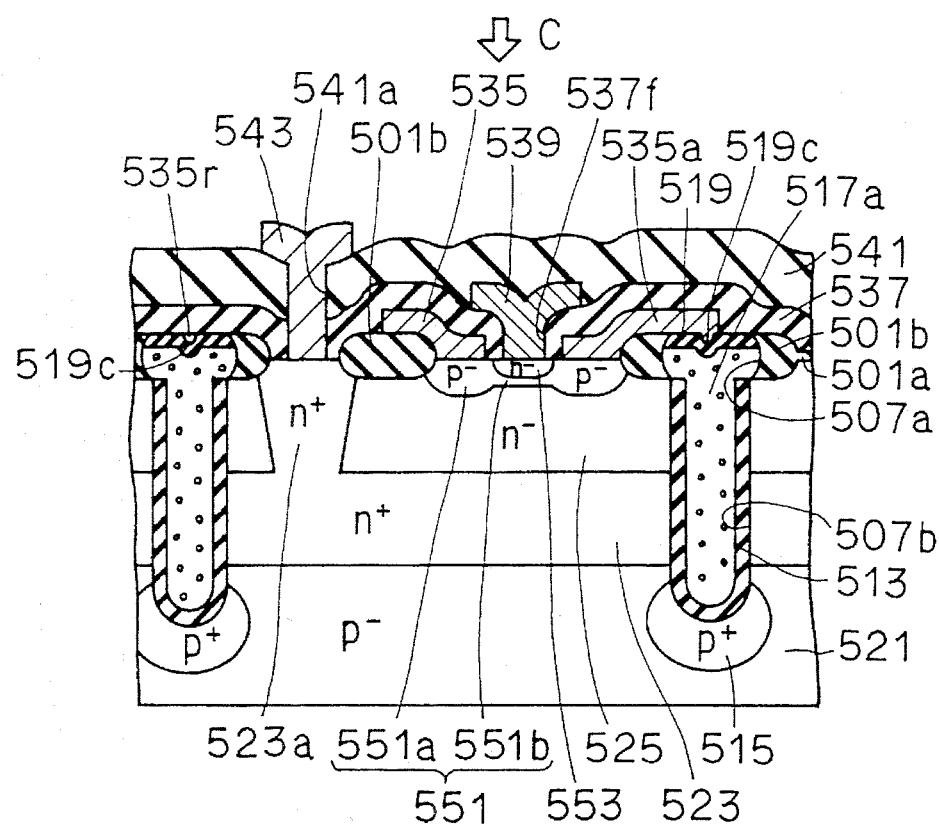
FIG. 69 is a sectional view schematically showing how individual conductive layers are electrically short-circuited in the conventional semiconductor device.
Figure 70:
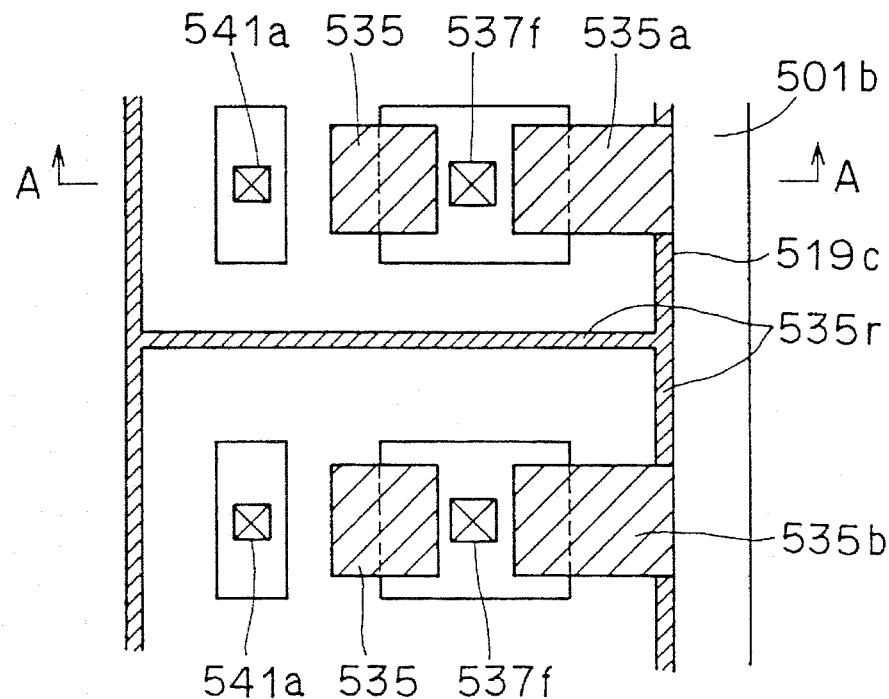
FIG. 70 is a plan view schematically showing how individual conductive layers are connected when using the conventional semiconductor device.

Referring to FIG. 49, a second insulating layer 219 made of silicon oxide is formed on filling layer 217a by the above thermal oxidation processing. Second insulating layer 219 is provided to fill up through hole 207a. Silicon nitride film 203 is then removed as shown in FIG. 50.

The method of manufacturing the semiconductor device having element isolation structure according to the third embodiment of the present invention when applied to a bipolar transistor is almost the same as in the first embodiment so that the description thereof will not be repeated.

In the method of manufacturing the semiconductor device according to the third embodiment of the present invention, covering layer 209a is formed to cover the entire sidewall of element isolation oxide film 201b within the region of through hole 207a in the steps shown in FIGS. 44 and 45 as in the second embodiment. Thus, diameter $W_{2B}$ of the opening of silicon nitride film 203 becomes substantially equal to diameter $W_{2A}$ of through hole 207a covered by covering layer 209a.

This prevents generation of the void in polycrystalline silicon layer 217 formed in the step shown in FIG. 46 in through hole 207a. Accordingly, the concave portion due to the void will not be formed on filling layer 217a formed by etching back of polycrystalline silicon layer 217.

In the semiconductor device of the present invention formed by the above manufacturing method, the concave portion due to the void is not generated in filling layer 217a as shown in FIG. 50. Therefore, even when patterning the conductive layer on the substrate wherein the element isolation structure is formed, the residue will not be generated. This prevents short circuit of individual conductive layers caused by the residue, so that the semiconductor device having the enhanced electrical reliability can be obtained.

While silicon nitride is used in the first and third embodiments and polycrystalline silicon is used in the second embodiment for the covering layer, the material used is not limited to those materials. More specifically, covering layer 109a in the second embodiment may be formed by amorphous silicon, and covering layer 209a in the third embodiment may be formed by silicon oxide film.

Also, while silicon oxide is used for the first insulating film in the first to third embodiments, the material used is not limited thereto and any material may be used so long as such a material has an insulating characteristic.

Further, the polycrystalline silicon without any impurity implanted thereinto is used for the filling layer in the first to third embodiments. Since a difference in the coefficient of thermal expansion between polycrystalline silicon and the silicon substrate is smaller than that between silicon oxide and the silicon substrate, even if the heat is applied in the following steps, defects are less likely to enter, for example, the substrate. Yet, the material used for the filling layer in the first to third embodiments is not limited to the above material.

Only, it is desirable to use such a material which has a large etching selectivity with respect to silicon oxide film 5, 105, 205 serving as the etching stopper during formation of the filling layer. This is because, if the material used for the filling layer has the small etching selectivity with respect to silicon oxide film 5, 105, 205, detection of the terminal in etching cannot be carried out to a full extent by such silicon oxide film 5, 105, 205.

While the silicon oxide film is used as second insulating layer 19, 119, 219 in the first to third embodiments, the material used for such second insulating layer 19, 119, 219 is not limited thereto and any material may be used so long as it has such an insulating characteristic as in silicon nitride.

Although the description has been made on the element isolation structure in the Bi-CMOS, especially for the one which isolates the bipolar transistor from the CMOS transistor, in the first to third embodiments, the semiconductor device according to the present invention may be used for isolating other elements.

As described above, the method of manufacturing the semiconductor device according to one aspect of the present invention, even if the silicon oxide film is removed by isotropic etching, the element isolation oxide film can be prevented from being etched since it is protected by the covering layer. Thus, the concave portion is not generated in the upper surface of the filling layer which fills the trench.

In the method of manufacturing the semiconductor device according to another aspect of the present invention, the diameter of the opening of the through hole is made substantially equal to the diameter of the opening of the protection film, thus preventing generation of the concave portion in the upper surface of the filling layer which fills the trench.

Therefore, in the semiconductor device according to the present invention fabricated based on either of the above two aspects, generation of the concave portion due to the void in the upper surface of the filling layer filling the trench can be avoided. Therefore, short circuit of individual conductive layers caused by the residue generated along the concave portion can be prevented, so that the semiconductor device having the enhanced electrical .reliability can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having an element isolation structure in which a trench isolation and an oxide film isolation are combined, comprising:

a silicon substrate having a main surface and a trench formed at the main surface;

an element isolation oxide film formed above said trench and having a through hole communicating with said trench;

a first insulating layer covering an internal wall of said trench;

a covering layer comprising a material different from the element isolation oxide film formed to cover a sidewall of said through hole so as to contact said first insulating layer;

a filling layer filling said trench and having a top surface thereof located within said through hole; and a second insulating layer formed on said filling layer to fill said through hole, wherein said covering layer comprises a material different from that of the filling layer.

* * * * *